(12) United States Patent
Weng et al.

(10) Patent No.: US 11,784,157 B2
(45) Date of Patent: Oct. 10, 2023

(54) PACKAGE COMPRISING INTEGRATED DEVICES COUPLED THROUGH A METALLIZATION LAYER

(71) Applicant: QUALCOMM Incorporated, San Diego, CA (US)

(72) Inventors: Li-Sheng Weng, San Diego, CA (US); Charles David Paynter, Encinitas, CA (US); Ryan Lane, San Diego, CA (US); Jianwen Xu, San Diego, CA (US); William Stone, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 91 days.

(21) Appl. No.: 17/339,830

(22) Filed: Jun. 4, 2021

(65) Prior Publication Data
US 2022/0392867 A1 Dec. 8, 2022

(51) Int. Cl.
*H01L 21/48* (2006.01)
*H01L 21/56* (2006.01)
(Continued)

(52) U.S. Cl.
CPC .......... *H01L 24/73* (2013.01); *H01L 21/4853* (2013.01); *H01L 21/4857* (2013.01);
(Continued)

(58) Field of Classification Search
CPC . H01L 21/4853; H01L 21/4857; H01L 21/56; H01L 24/73; H01L 24/16; H01L 24/17; H01L 24/20; H01L 24/24; H01L 25/105; H01L 23/49838; H01L 23/5385; H01L 23/5386; H01L 23/3121;
(Continued)

(56) References Cited

U.S. PATENT DOCUMENTS 11,244,906 B2 * 2/2022 Huang ................ H01L 21/6836
2014/0252598 A1 * 9/2014 Yu ........................... H01L 24/11
257/737
(Continued)

FOREIGN PATENT DOCUMENTS

TW I721848 B 3/2021

OTHER PUBLICATIONS

International Search Report and Written Opinion—PCT/US2022/027875—ISA/EPO—dated Sep. 29, 2022.

*Primary Examiner* — Alonzo Chambliss
(74) *Attorney, Agent, or Firm* — Loza & Loza, LLP

(57) ABSTRACT

A package comprising a first integrated device comprising a plurality of first pillar interconnects; an encapsulation layer at least partially encapsulating the first integrated device; a metallization portion located over the first integrated device and the encapsulation layer, wherein the metallization portion includes at least one passivation layer and a plurality of metallization layer interconnects, wherein the plurality of first pillar interconnects is coupled to the plurality of metallization layer interconnects; and a second integrated device comprising a plurality of second pillar interconnects, wherein the second integrated device is coupled to the plurality of metallization layer interconnects through a plurality of second pillar interconnects and a plurality of solder interconnects.

33 Claims, 19 Drawing Sheets

SIDE CROSS SECTIONAL PROFILE VIEW

(51) Int. Cl.
   *H01L 23/31* (2006.01)
   *H01L 23/498* (2006.01)
   *H01L 23/538* (2006.01)
   *H01L 23/00* (2006.01)
   *H01L 25/10* (2006.01)

(52) U.S. Cl.
   CPC .......... *H01L 21/56* (2013.01); *H01L 23/3121* (2013.01); *H01L 23/3171* (2013.01); *H01L 23/49811* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 24/17* (2013.01); *H01L 24/20* (2013.01); *H01L 24/24* (2013.01); *H01L 25/105* (2013.01); *H01L 2224/16235* (2013.01); *H01L 2224/1703* (2013.01); *H01L 2224/17163* (2013.01); *H01L 2224/2105* (2013.01); *H01L 2224/24145* (2013.01); *H01L 2224/73204* (2013.01); *H01L 2224/73209* (2013.01); *H01L 2225/1023* (2013.01); *H01L 2225/1035* (2013.01); *H01L 2225/1041* (2013.01); *H01L 2225/1058* (2013.01)

(58) Field of Classification Search
   CPC ........... H01L 23/3171; H01L 23/49811; H01L 23/49822; H01L 23/49833
   See application file for complete search history.

(56) References Cited

U.S. PATENT DOCUMENTS

| | | | |
|---|---|---|---|
| 2016/0322323 A1* | 11/2016 | Lai | H01L 24/14 |
| 2018/0076179 A1* | 3/2018 | Hsu | H01L 24/14 |
| 2018/0366439 A1 | 12/2018 | Lin et al. | |
| 2019/0103386 A1 | 4/2019 | Chen et al. | |
| 2021/0202437 A1 | 7/2021 | Chang Chien et al. | |
| 2022/0139898 A1* | 5/2022 | Chen | H01L 21/568 257/777 |

\* cited by examiner

*SIDE CROSS SECTIONAL PROFILE VIEW*

PLAN VIEW

SIDE CROSS SECTIONAL PROFILE VIEW

PLAN VIEW

SIDE CROSS SECTIONAL PROFILE VIEW

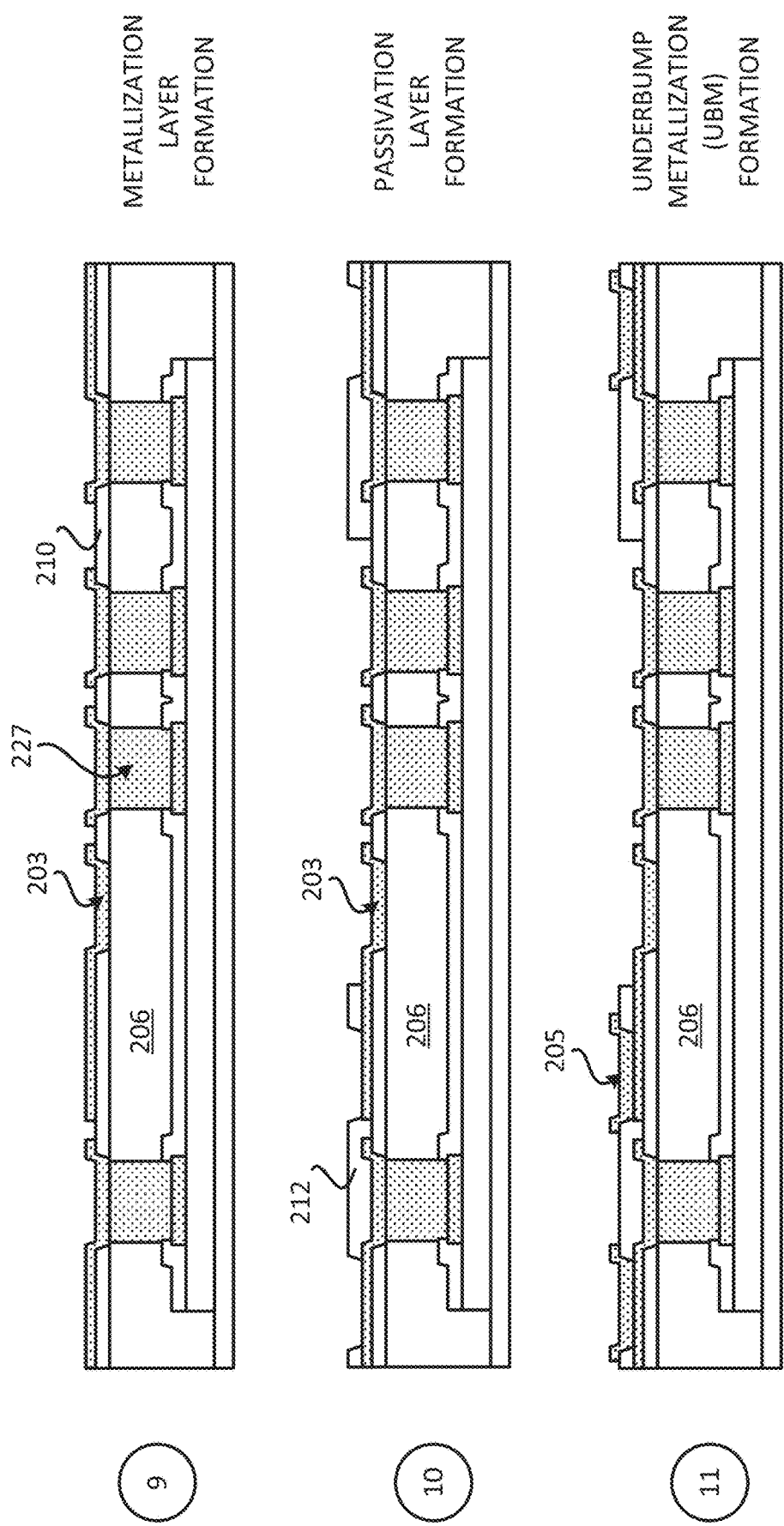

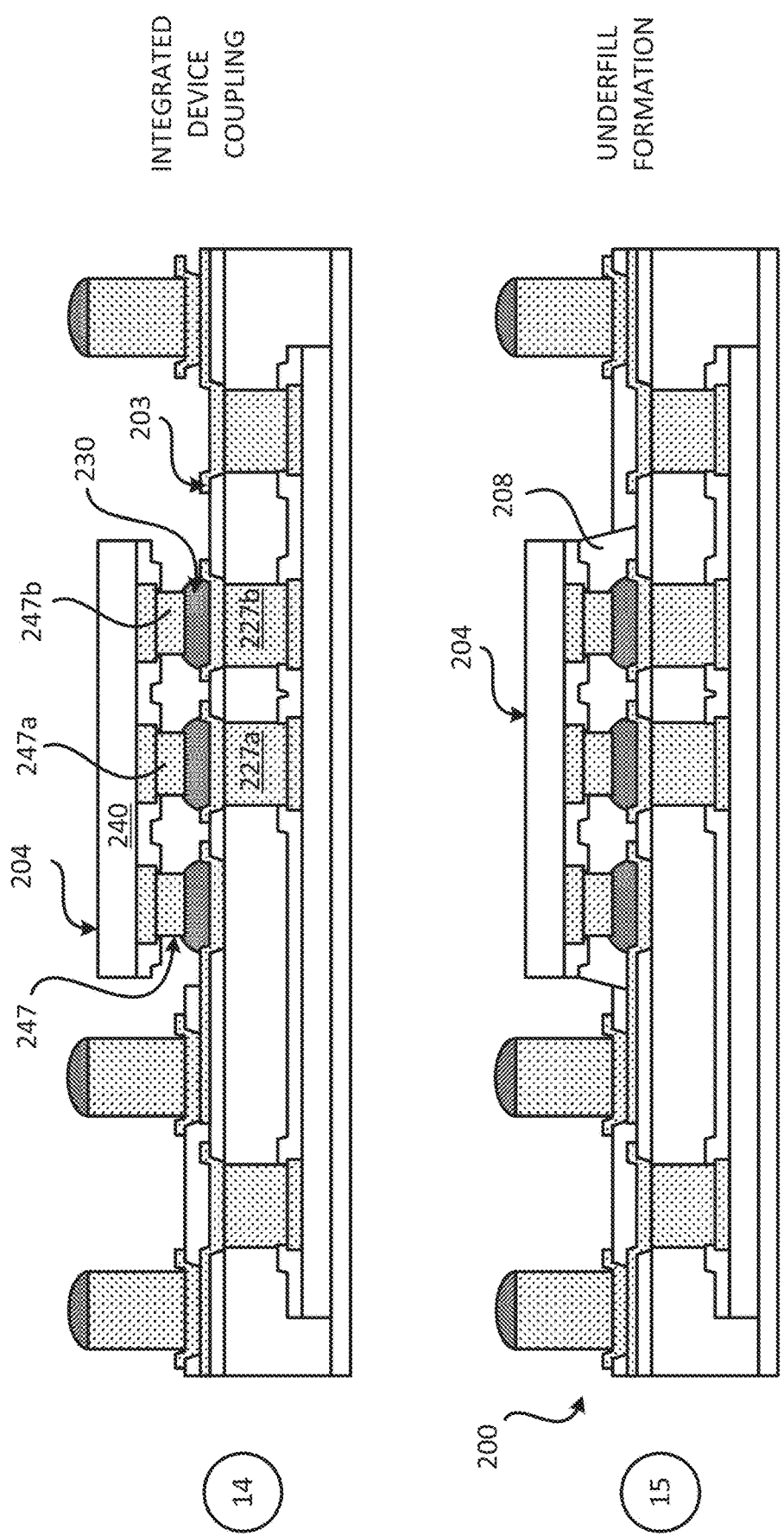

US 11,784,157 B2

PACKAGE COMPRISING INTEGRATED DEVICES COUPLED THROUGH A METALLIZATION LAYER

FIELD

Various features relate to package comprising integrated devices.

BACKGROUND

FIG. 1 illustrates a package 100 that includes a substrate 102, an integrated device 104, and an integrated device 106. The substrate 102 includes at least one dielectric layer 120 and a plurality of interconnects 122. A plurality of solder interconnects 124 is coupled to the plurality of interconnects 122. A plurality of solder interconnects 144 is coupled to the substrate 102 and the integrated device 104. A plurality of solder interconnects 164 is coupled to the substrate 102 and the integrated device 106. Positioning the integrated device 104 next to the integrated device 106 increases the footprint of the package 100. There is an ongoing need to provide more compact packages and packages that include properly aligned components.

SUMMARY

Various features relate to package comprising integrated devices.

One example provides a package comprising a first integrated device comprising a plurality of first pillar interconnects; an encapsulation layer at least partially encapsulating the first integrated device; a metallization portion located over the first integrated device and the encapsulation layer, wherein the metallization portion includes at least one passivation layer and a plurality of metallization layer interconnects, wherein the plurality of first pillar interconnects is coupled to the plurality of metallization layer interconnects; and a second integrated device comprising a plurality of second pillar interconnects, wherein the second integrated device is coupled to the plurality of metallization layer interconnects through the plurality of second pillar interconnects and a plurality of solder interconnects.

Another example provides an apparatus comprising a first integrated device comprising a plurality of first pillar interconnects; means for encapsulation at least partially encapsulating the first integrated device; a metallization portion located over the first integrated device and the encapsulation layer, wherein the metallization portion includes at least one passivation layer and means for metallization interconnection, wherein the plurality of first pillar interconnects is coupled to the means for metallization interconnection; and a second integrated device comprising a plurality of second pillar interconnects, wherein the second integrated device is coupled to the metallization interconnection through the plurality of second pillar interconnects and a plurality of solder interconnects.

Another example provides a method for fabricating a package. The method provides a first integrated device comprising a plurality of first pillar interconnects. The method forms an encapsulation layer over the first integrated device. The method forms a metallization portion over the first integrated device and the encapsulation layer, wherein the metallization portion includes at least one passivation layer and a plurality of metallization layer interconnects, wherein the plurality of first pillar interconnects is coupled to the plurality of metallization layer interconnects. The method couples a second integrated device to the plurality of metallization layer interconnects through a plurality of second pillar interconnects and a plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 7A-7E illustrate an exemplary sequence for fabricating a package that includes integrated devices and a metallization portion.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first integrated device comprising a plurality of first pillar interconnects, an encapsulation layer at least partially encapsulating the first integrated device, a metallization portion located over the first integrated device and the encapsulation layer, and a second integrated device comprising a plurality of second pillar interconnects. The metallization portion includes at least one passivation layer and a plurality of metallization layer interconnects. The plurality of first pillar interconnects is coupled to the plurality of metallization layer interconnects. The second integrated device is coupled to the plurality of metallization layer interconnects through a plurality of second pillar interconnects and a plurality of solder interconnects. In some implementations, at least one second pillar interconnect vertically overlaps with a first pillar interconnect. In some implementations, at least two second pillar interconnects from a row second pillar interconnects vertically overlaps with at least two first pillar interconnects from a row of first pillar interconnects. In some implementations, a first pillar interconnect is coupled to a backside of a particular metallization layer interconnect, and a second pillar interconnect is coupled to a frontside of the particular metallization layer interconnect. In some implementations, the second integrated device at least partially overlaps vertically with the first integrated device.

Figure 1:
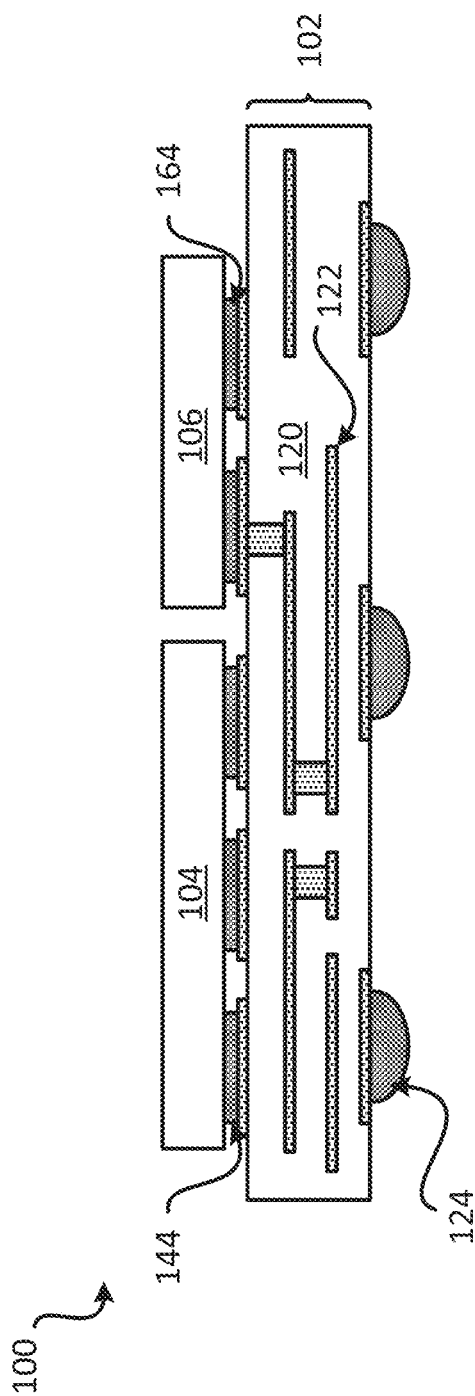
FIG. 1 illustrates a package that includes a substrate and integrated devices.
Figure 2:
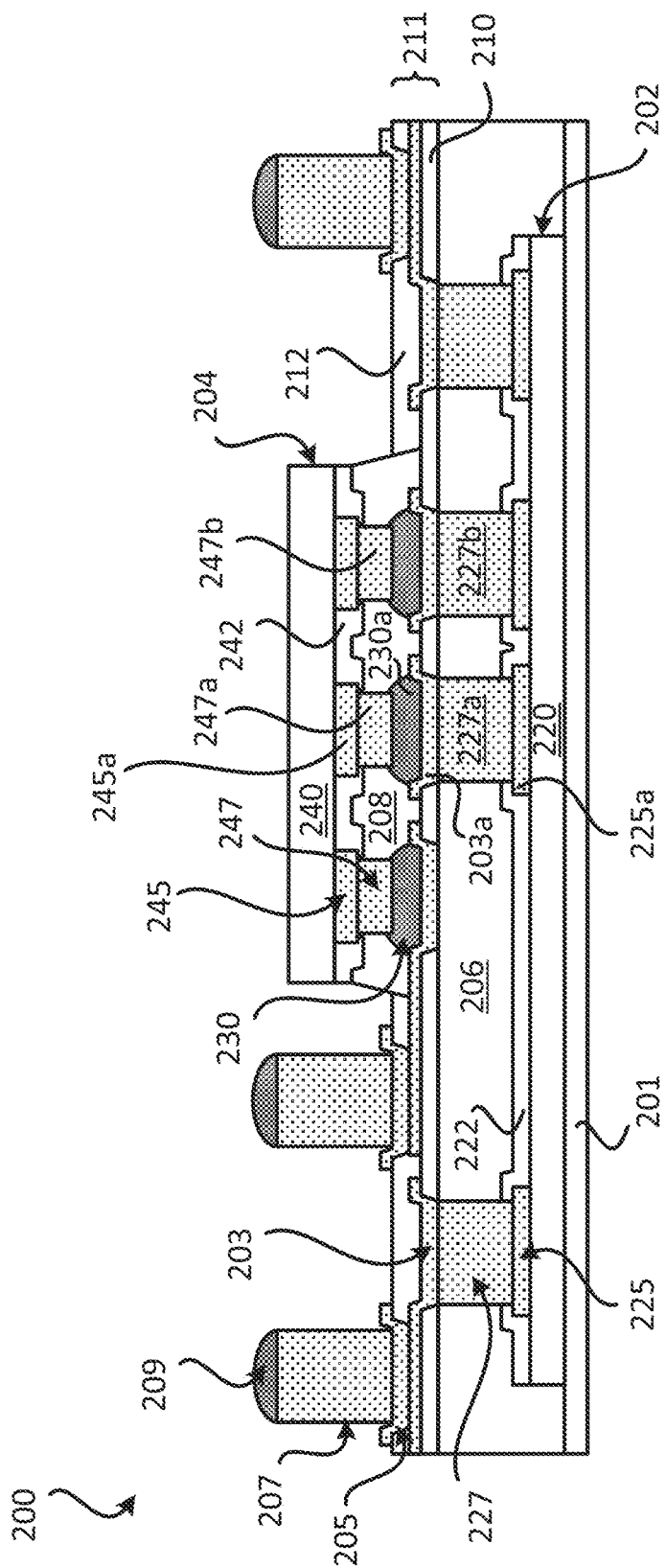
FIG. 2 illustrates a cross sectional profile view of an exemplary package that includes integrated devices and a metallization portion.

Exemplary Package Comprising Integrated Devices Coupled Through a Metallization Layer FIG. 2 illustrates an example of a package 200 that includes integrated devices coupled through a metallization layer. The package 200 includes an integrated device 202, an integrated device 204, a metallization layer interconnect 203, an encapsulation layer 206, a plurality of under bump metallization (UBM) interconnects 205, a plurality of package pillar interconnects 207, an underfill 208, a plurality of solder interconnects 209, a passivation layer 210, and a passivation layer 212. As will be further described below in detail, the integrated device 202 and the integrated device 204 are located as part of the package 200 in such a way that the integrated device 202 may at least partially vertically overlap with the integrated device 204. In one example, a pillar interconnect (e.g., first pillar interconnect) from the integrated device 202 may at least partially vertically overlap with a pillar interconnect (e.g., second pillar interconnect) from the integrated device 204. The use of at least partially vertically overlapping pillar interconnects may mean that a pair of opposing pillar interconnect from different integrated devices may be configured to be coupled to a same portion of metallization layer. The configuration helps provide reliable, robust electrical coupling between integrated devices, even there is die shift (e.g., integrated device shift) during the fabrication of the package that includes integrated devices and the metallization layer.

The integrated device 202 (e.g., first integrated device) may include a die (e.g., bare semiconductor die). The integrated device 202 includes a die substrate 220, a passivation layer 222, and a metal layer 225. The integrated device 202 may include a plurality of pillar interconnects 227. The die substrate 220 may include silicon. The die substrate 220 may include a plurality of active devices (e.g., transistors). A front end of line (FEOL) process may be used to fabricate the die substrate 220. The metal layer 225 may be located over the die substrate 220. The metal layer 225 may include pads for the integrated device 202. The metal layer 225 may be a top layer of the integrated device 202. The metal layer 225 may be configured to be electrically coupled to the active devices (e.g., transistors). The passivation layer 222 may be located over the metal layer 225 and the die substrate 220. The integrated device 202 may include a frontside and backside. The frontside the integrated device 202 may include the side of the integrated device 202 that includes the metal layer 225 and/or the passivation layer 222. The backside of the integrated device 202 may include the side that faces away from the metal layer 225. The backside of the integrated device 202 may include the side that includes the die substrate 220. The plurality of pillar interconnects 227 is coupled to the metal layer 225. The plurality of pillar interconnects 227 may include pillar interconnect 227a and pillar interconnects 227b.

In some implementations, the integrated device 202 may include one or more interconnects and one or more dielectric layers located over the die substrate 220. The one or more interconnects and one or more dielectric layers may be located between the die substrate 220 and the passivation layer 222. In such instances, the metal layer 225 may be coupled to the one or more interconnects. The one or more interconnects may be coupled to one or more active devices (e.g., transistors). A back end of line (BEOL) process may be used to fabricate the one or more interconnects and one or more dielectric layers.

The package 200 may include a backside lamination (BSL) layer 201. The backside lamination layer 201 is coupled to the backside of the integrated device 202 and the encapsulation layer 206. For example, the backside lamination layer 201 may be coupled to the backside of the die substrate 220.

The encapsulation layer 206 is located over the backside lamination layer 201 and the integrated device 202. The encapsulation layer 206 may at least partially encapsulate the integrated device 202. The encapsulation layer 206 may at least partially encapsulate the plurality of pillar interconnects 227. The encapsulation layer 206 may include a mold, a resin, an epoxy and/or polymer. The encapsulation layer 206 may be a means for encapsulation.

The metallization layer interconnect 203 is coupled to the plurality of pillar interconnects 227 (e.g., first pillar interconnects). The metallization layer interconnect 203 may be a means for metallization interconnection. The metallization layer interconnect 203 may include at least one redistribution layer (RDL) interconnects (e.g., redistribution interconnects). A redistribution layer interconnect may include a U-shape or V-shape. The terms "U-shape" and "V-shape" shall be interchangeable. The terms "U-shape" and "V-shape" may refer to the side cross sectional profile shape of the interconnects and/or redistribution layer interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect). The at least one metallization layer interconnect 203 may be formed and located over the passivation layer 210. The passivation layer 212 may be formed and located over the at least one metallization layer interconnect 203 and the passivation layer 210. The at least one metallization layer interconnect 203, the passivation layer 210 and/or the passivation layer 212 may be part of a metallization portion 211 (e.g., redistribution portion) for the package 200. The metallization portion 211 may be located over the encapsulation layer 206 and the plurality of pillar interconnects 227. The frontside of the integrated device 202 may face the backside of the metallization portion (e.g., backside of the at least one metallization layer interconnect 203, bottom side of the at least one metallization layer interconnect 203).

The plurality of UBM interconnects 205 is coupled to the at least one metallization layer interconnect 203. The plurality of package pillar interconnects 207 is coupled to the plurality of UBM interconnects 205. In some implementations, the plurality of UBM interconnects 205 may be considered part of the metallization portion 211. The plurality of solder interconnects 209 is coupled to the plurality of package pillar interconnects 207.

The integrated device 204 (e.g., second integrated device) may include a die (e.g., bare semiconductor die). The integrated device 204 includes a die substrate 240, a passivation layer 242, and a metal layer 245. The integrated device 204 may include a plurality of pillar interconnects 247. The die substrate 240 may include silicon. The die substrate 240 may include a plurality of active devices (e.g., transistors). A front end of line (FEOL) process may be used to fabricate the die substrate 240. The metal layer 245 may be located over the die substrate 240. The metal layer 245 may include pads for the integrated device 204. The metal layer 245 may be a top layer of the integrated device 204. The metal layer 245 may be configured to be electrically coupled to the active devices (e.g., transistors). The passivation layer 242 may be located over the metal layer 245 and the die substrate 240. The integrated device 204 may include a frontside and backside. The frontside of the integrated device 204 may include the side of the integrated device 204 that includes the metal layer 245 and/or the passivation layer 242. The backside of the integrated device 204 may include the side that faces away from the metal layer 245. The backside of the integrated device 204 may include the side that includes the die substrate 240. The plurality of pillar interconnects 247 is coupled to the metal layer 245. The plurality of pillar interconnects 247 may include pillar interconnect 247*a* and pillar interconnects 247*b*.

In some implementations, the integrated device 204 may include one or more interconnects and one or more dielectric layers located over the die substrate 240. The one or more interconnects and one or more dielectric layers may be located between the die substrate 240 and the passivation layer 242. In such instances, the metal layer 245 may be coupled to the one or more interconnects. The one or more interconnects may be coupled to one or more active devices (e.g., transistors). A back end of line (BEOL) process may be used to fabricate the one or more interconnects and one or more dielectric layers.

The integrated device 204 is coupled to the frontside of the metallization portion 211 of the package 200. For example, the integrated device 204 may be coupled to a frontside of the metallization layer interconnect 203 (e.g., top side of the metallization layer interconnect 203) through a plurality of solder interconnects 230. The frontside of the integrated device 204 may face the frontside of the metallization portion 211 (e.g., frontside of the at least one metallization layer interconnect 203). The plurality of solder interconnects 230 is coupled to the plurality of pillar interconnects 247 and the metallization layer interconnect 203. In some implementations, the plurality of pillar interconnects 247 and/or the plurality of solder interconnects 230 may touch the metallization layer interconnect 203. An underfill 208 is located between the integrated device 204 and the metallization portion 211. For example, the underfill 208 may be located between (i) the integrated device 204 and (ii) the metallization layer interconnect 203, the passivation layer 210 and/or the passivation layer 212. The underfill 208 may laterally surround the plurality of pillar interconnects 247.

As shown in FIG. 2, the integrated device 204 at least partially overlaps vertically with the integrated device 202. The front side of the integrated device 202 faces the front side of the integrated device 204. The pillar interconnect 247*a* (e.g., second pillar interconnect) of the integrated device 204 vertically overlaps with the pillar interconnect 227*a* (e.g., first pillar interconnect) of the integrated device 202. Similarly, the pillar interconnect 247*b* of the integrated device 204 vertically overlaps with the pillar interconnect 227*b* of the integrated device 202.

The plurality of pillar interconnects 227 may be arranged in rows of pillar interconnects and/or columns of pillar interconnects. The plurality of pillar interconnects 247 may be arranged in rows of pillar interconnects and/or columns of pillar interconnects. It is noted that rows of pillar interconnects may be used interchangeably with a column of pillar interconnects. In some implementations, at least two second pillar interconnects from a row second pillar interconnects (e.g., 247) vertically overlaps with at least two first pillar interconnects from a row of first pillar interconnects (e.g., 227). A row of pillar interconnects may include more than two pillar interconnects. A column of pillar interconnects may include more than two pillar interconnects. Examples of rows and columns for the first pillar interconnects and/or the second pillar interconnects include configurations of 2×1, 3×1, 4×1, 5×1, 2×2, 3×2, 4×2, and 5×2 of pillar interconnects. The pillar interconnects may have various width (e.g., diameter), spacing and thickness. For example, the pillar interconnects (e.g., 227, 247) may have a width of about 80 micrometers, a spacing of about 50 micrometers and a thickness of about 50 micrometers.

A first pillar interconnect (from a plurality of pillar interconnects 227) may be coupled to a backside (e.g., bottom side) of a particular metallization layer interconnect 203, and a second pillar interconnect (e.g., from a plurality of pillar interconnects 247) may be coupled to a frontside (e.g., top side) of the particular metallization layer interconnect 203.

The integrated device 202 may be configured to be electrically coupled to the integrated device 204 through the at least one metallization layer interconnect 203. For example, the integrated device 202 may be configured to be electrically coupled to the integrated device 204 through the metal layer 225*a*, the pillar interconnect 227*a*, the metallization layer interconnect 203*a*, the solder interconnect 230*a*, the pillar interconnect 247*a* and the metal layer 245*a*.

The integrated device 202 and the integrated device 204 are coupled to the metallization portion 211 such that a frontside of the integrated device 202 faces an opposite direction than a front side of the integrated device 204. The plurality of pillar interconnects 227 may be coupled to a first side of the metallization portion 211, and the plurality of second pillar interconnects 247 may be coupled to a second side of the metallization portion 211, where the second side is opposite to the first side. The plurality of pillar interconnects 227 may be coupled to a first side of the plurality of metallization layer interconnects 203, and the plurality of pillar interconnects 247 may be coupled to a second side of the plurality of metallization layer interconnects 203, where the second side is opposite to the first side.

The package 200 may be configured to allow one or more electrical currents to travel to/from the integrated device 202 through the solder interconnect 209, the package pillar interconnect 207, the UBM interconnect 205, the metallization layer interconnect 203, the pillar interconnect 227 and the metal layer 225.

The package 200 may be configured to allow one or more electrical currents to travel to/from the integrated device 204 through the solder interconnect 209, the package pillar interconnect 207, the UBM interconnect 205, the metallization layer interconnect 203, the solder interconnect 230, the pillar interconnect 247 and the metal layer 245. As mentioned above, the configuration shown in FIG. 2 helps provide reliable and robust electrically connections between the integrated device 202 and the integrated device 204, even if a die shift occurs during the fabrication of the package. A die shift may mean a lateral movement of the integrated device and/or a rotational movement of the integrated device, resulting in pillar interconnects to collectively move and/or collectively rotate into a different position. Even with a die shift, the relative pattern of the pillar interconnects (e.g., first pillar interconnects 227) within the integrated device 202 remain the same. Since the overall pattern of the first pillar interconnects 227 with the integrated device 202 remains the same except for collective lateral and/or rotational movements of the first pillar interconnects 227, during the placement (e.g., coupling) of the integrated device 204 and the second pillar interconnects 247 to the metallization portion 211, the integrated device 204 and the second pillar interconnects 247 may be shifted and/or rotated so that at least one of the second pillar interconnects 247 vertically overlaps with at least one of the first pillar interconnects 227 from the integrated device 202. One benefit of the configuration is that a die shift in the package (e.g., due to curing and/or shrinkage of the encapsulation layer 206) may not necessarily result in a faulty or defective package. For example, if there is a shift and/or rotation in the integrated device 202, the metallization layer interconnect 203 may be shifted and/or rotated in a similar matter to account for the shift and/or rotation in the integrated device 202. Similarly, the integrated device 204 may be shifted and/or rotated in a similar matter to also account in the shift and/or rotation of the integrated device 202 and the metallization layer interconnect 203. In some implementations, the shifting and/or rotation of the integrated device 202 and the metallization layer interconnect 203 would not require an integrated device 204 with different pillar interconnect arrangements, since the shift and/or rotation may be throughout components of the package. For example, if one pillar interconnect from the plurality of pillar interconnects 227 is shifted and/or rotated during the fabrication process of the package, then the other pillar interconnects from the plurality of pillar interconnects 227 may also be shifted and/or rotated during the fabrication process such that the pillar interconnects from plurality of pillar interconnects 227 retain their relative positions between each other.

Figure 3:
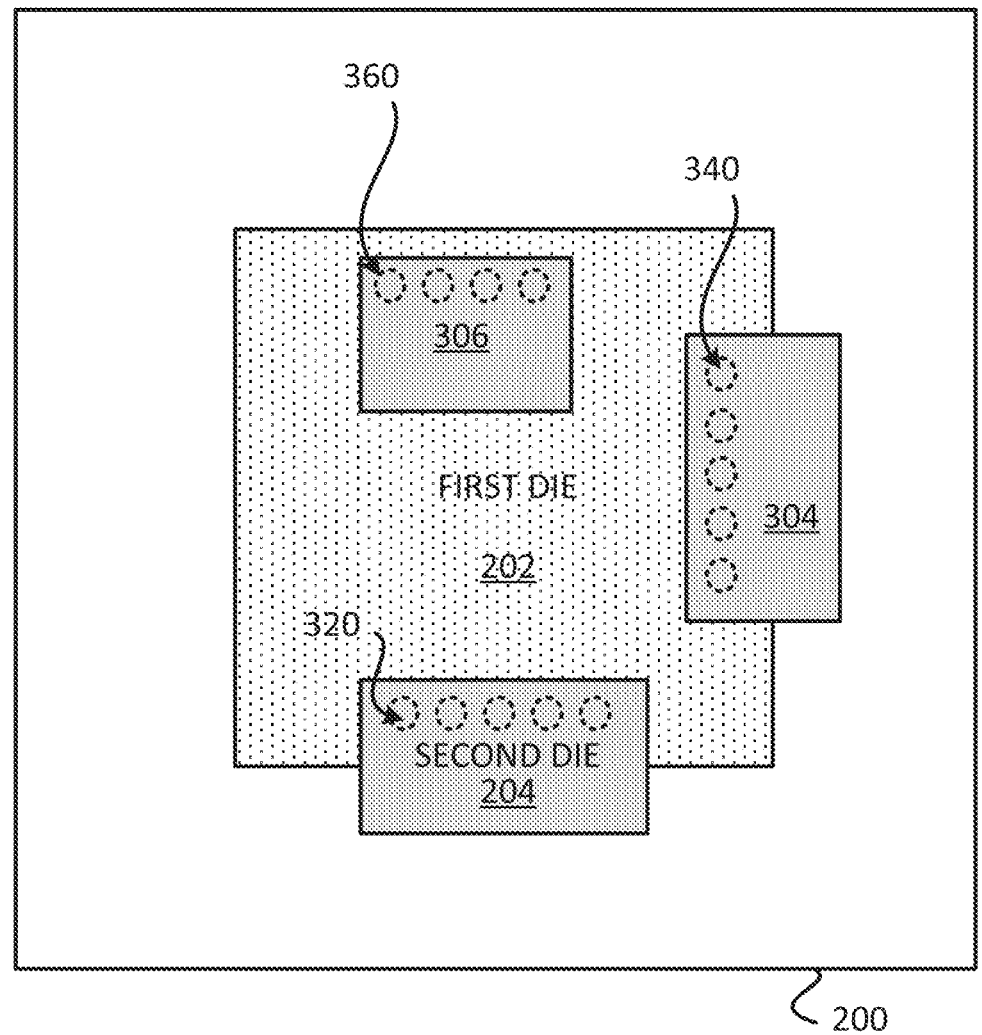
FIG. 3 illustrates a plan view of an exemplary package that includes integrated devices and a metallization portion.

FIG. 3 illustrates a plan view of the package 200 that includes the integrated device 202, the integrated device 204, an integrated device 304 and an integrated device 306. FIG. 3 illustrates how different integrated devices may vertically overlap with another integrated device. As shown in FIG. 3, the integrated device 204, the integrated device 304 and the integrated device 306 each vertically overlap (e.g., partial vertical overlap, complete vertical overlap) with the integrated device 202. The frontside of the integrated device 204, the integrated device 304 and the integrated device 306, each face the frontside of the integrated device 202.

The integrated device 204 partially overlaps vertically with the integrated device 202. In some implementations, at least one pillar interconnect of the integrated device 204 at least partially overlaps vertically with at least one pillar interconnect of the integrated device 202. This vertical overlap of pillar interconnects may be represented by overlap areas 320. The integrated device 304 partially overlaps vertically with the integrated device 202. In some implementations, at least one pillar interconnect of the integrated device 304 at least partially overlaps vertically with at least one pillar interconnect of the integrated device 202. This vertical overlap of pillar interconnects may be represented by overlap areas 340.

The integrated device 306 vertically overlaps (e.g., completely vertically overlaps) with the integrated device 202. In some implementations, at least one pillar interconnect of the integrated device 306 at least vertically overlaps with at least one pillar interconnect of the integrated device 202. This vertical overlap of pillar interconnects may be represented by overlap areas 360. It is noted that the overlap areas are exemplary. It is noted that the overlap areas shown in FIG. 3 are not intended to show all the possible overlaps of pillar interconnects of different integrated devices. In some implementations, there may be more or less overlap areas between different pillar interconnects of different integrated devices. Different implementations may have different overlap areas.

Figure 4:
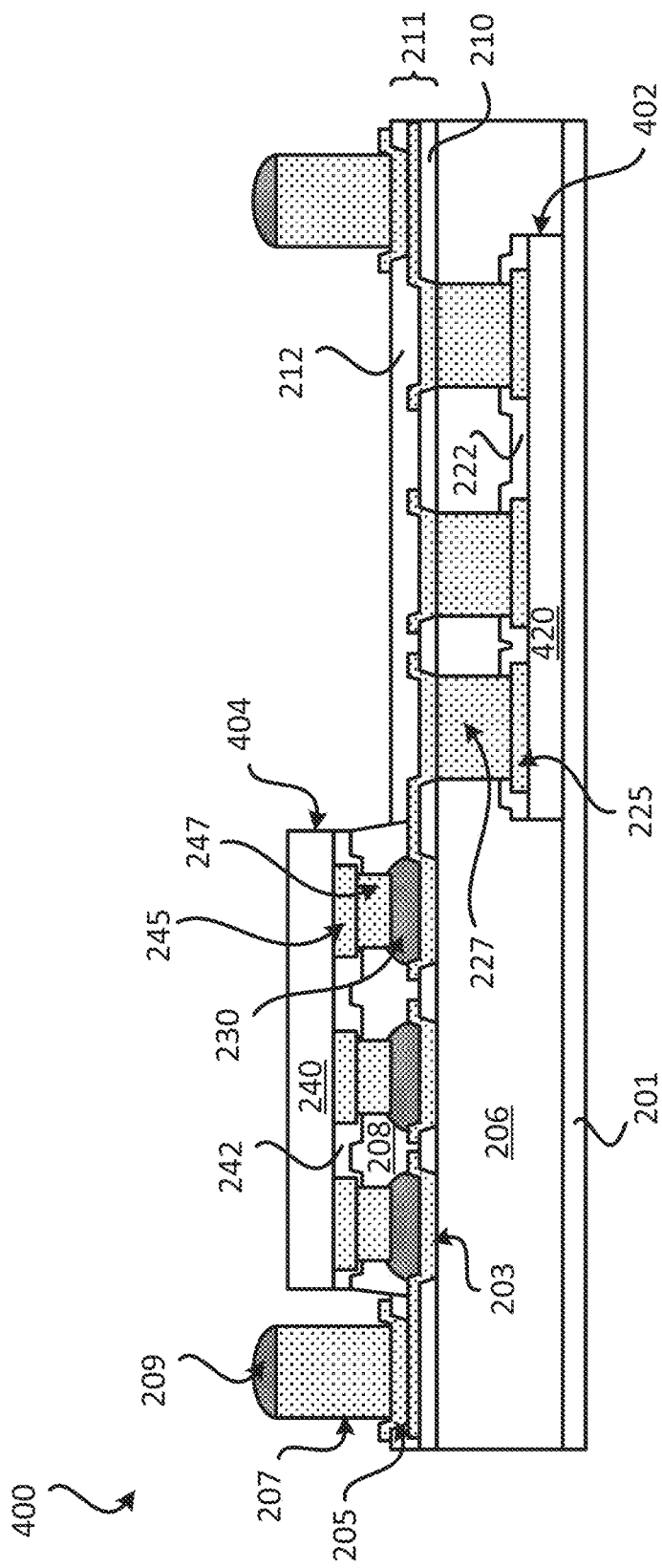
FIG. 4 illustrates a cross sectional profile view of an exemplary package that includes integrated devices and a metallization portion.

Exemplary Package Comprising Integrated Devices Coupled Through a Metallization Layer FIG. 4 illustrates an example of a package 400 that includes integrated devices coupled through a metallization layer. The package 400 is similar to the package 200, and includes similar components as the package 200. The package 400 includes an integrated device 402, an integrated device 404, the metallization layer interconnect 203, the encapsulation layer 206, the plurality of under bump metallization (UBM) interconnects 205, a plurality of package pillar interconnects 207, an underfill 208, a plurality of solder interconnects 209, a passivation layer 210, and a passivation layer 212. As will be further described below in detail, the integrated device 402 and the integrated device 404 are located as part of the package 400 in such a way that a front side of the integrated device 402 faces a frontside of the metallization portion 211 and a frontside of the integrated device 404 faces a backside of the metallization portion 211. The configuration of the package 400 may provide similar benefits as the package 200. For example, the package 400 may be fully functional even if a die shift has occurred during the fabrication of the package 400. Thus, as described above for the package 200, one benefit of the configuration is that a die shift in the package 400 may not necessarily result in a faulty or defective package. For example, if there is a shift and/or rotation in the integrated device 402, the metallization layer interconnect 203 may be shifted and/or rotated in a similar matter to account for the shift and/or rotation in the integrated device 402. Similarly, the integrated device 404 may be shifted and/or rotated in a similar matter to also account in the shift and/or rotation of the integrated device 402 and the metallization layer interconnect 203. In some implementations, the shifting and/or rotation of the integrated device 402 and the metallization layer interconnect 203 would not require an integrated device 404 with different pillar interconnect arrangements, since the shift and/or rotation may be throughout components of the package.

The integrated device 402 (e.g., first integrated device) may include a die (e.g., bare semiconductor die). The integrated device 402 includes a die substrate 420, a passivation layer 222, and a metal layer 225. The integrated device 402 may include a plurality of pillar interconnects 227. The die substrate 420 may include silicon. The die substrate 420 may include a plurality of active devices (e.g., transistors). A front end of line (FEOL) process may be used to fabricate the die substrate 420. The metal layer 225 may be located over the die substrate 420. The metal layer 225 may include pads for the integrated device 402. The metal layer 225 may be a top layer of the integrated device 402. The metal layer 225 may be configured to be electrically coupled to the active devices (e.g., transistors). The passivation layer 222 may be located over the metal layer 225 and the die substrate 420. The integrated device 402 may include a frontside and backside. The frontside of the integrated device 402 may include the side of the integrated device 402 that includes the metal layer 225 and/or the passivation layer 222. The backside of the integrated device 402 may include the side that includes the die substrate 420. The backside of the integrated device 402 may include the side that faces away from the metal layer 225. The plurality of pillar interconnects 227 is coupled to the metal layer 225.

In some implementations, the integrated device 402 may include one or more interconnects and one or more dielectric layers located over the die substrate 420. The one or more interconnects and one or more dielectric layers may be located between the die substrate 420 and the passivation layer 222. In such instances, the metal layer 225 may be coupled to the one or more interconnects. The one or more interconnects may be coupled to one or more active devices (e.g., transistors). A back end of line (BEOL) process may be used to fabricate the one or more interconnects and one or more dielectric layers.

The package 400 may include a backside lamination (BSL) layer 201. The backside lamination layer 201 is coupled to the backside of the integrated device 402 and the encapsulation layer 206. For example, the backside lamination layer 201 may be coupled to the backside of the die substrate 420.

The encapsulation layer 206 is located over the backside lamination layer 201 and the integrated device 402. The encapsulation layer 206 may at least partially encapsulate the integrated device 402. The encapsulation layer 206 may at least partially encapsulate the plurality of pillar interconnects 227. The encapsulation layer 206 may include a mold, a resin, an epoxy and/or polymer. The encapsulation layer 206 may be a means for encapsulation.

The metallization layer interconnect 203 is coupled to the plurality of pillar interconnects 227 (e.g., first pillar interconnects). The metallization layer interconnect 203 may include at least one redistribution layer (RDL) interconnects (e.g., redistribution interconnects). A redistribution layer interconnect may include a U-shape or V-shape. The terms "U-shape" and "V-shape" shall be interchangeable. The terms "U-shape" and "V-shape" may refer to the side cross sectional profile shape of the interconnects and/or redistribution layer interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect). The at least one metallization layer interconnect 203 may be formed and located over the passivation layer 210. The passivation layer 212 may be formed and located over the at least one metallization layer interconnect 203 and the passivation layer 210. The at least one metallization layer interconnect 203, the passivation layer 210 and/or the passivation layer 212 may be part of metallization portion 211 (e.g., redistribution portion) for the package 400. The metallization portion 211 may be located over the encapsulation layer 206 and the plurality of pillar interconnects 227. The frontside of the integrated device 402 may face the backside of the metallization portion 211 (e.g., backside of the at least one metallization layer interconnect 203). The integrated device 402 and the integrated device 404 are coupled to the metallization portion 211 such that a frontside of the integrated device 402 faces an opposite direction than a front side of the integrated device 404. The plurality of pillar interconnects 227 may be coupled to a first side of the metallization portion 211, and the plurality of second pillar interconnects 247 may be coupled to a second side of the metallization portion 211, where the second side is opposite to the first side. The plurality of pillar interconnects 227 may be coupled to a first side of the plurality of metallization layer interconnects 203, and the plurality of pillar interconnects 247 may be coupled to a second side of the plurality of metallization layer interconnects 203, where the second side is opposite to the first side.

The plurality of UBM interconnects 205 is coupled to the at least one metallization layer interconnect 203. The plurality of package pillar interconnects 207 is coupled to the plurality of UBM interconnects 205. The plurality of UBM interconnects 205 may be considered part of the metallization portion 211. The plurality of solder interconnects 209 is coupled to the plurality of package pillar interconnects 207.

The integrated device 404 (e.g., second integrated device) may include a die (e.g., bare semiconductor die). The integrated device 404 includes a die substrate 240, a passivation layer 242, and a metal layer 245. The integrated device 404 may include a plurality of pillar interconnects 247. The die substrate 240 may include silicon. The die substrate 240 may include a plurality of active devices (e.g., transistors). A front end of line (FEOL) process may be used to fabricate the die substrate 240. The metal layer 245 may be located over the die substrate 240. The metal layer 245 may include pads for the integrated device 404. The metal layer 245 may be a top layer of the integrated device 404. The metal layer 245 may be configured to be electrically coupled to the active devices (e.g., transistors). The passivation layer 242 may be located over the metal layer 245 and the die substrate 240. The integrated device 404 may include a frontside and backside. The frontside of the integrated device 404 may include the side of the integrated device 404 that includes the metal layer 245 and/or the passivation layer 242. The backside of the integrated device 404 may include the side that faces away from the metal layer 245. The plurality of pillar interconnects 247 is coupled to the metal layer 245. The plurality of pillar interconnects 247 may include pillar interconnect 247a and pillar interconnects 247b.

In some implementations, the integrated device 404 may include one or more interconnects and one or more dielectric layers located over the die substrate 240. The one or more interconnects and one or more dielectric layers may be located between the die substrate 240 and the passivation layer 242. In such instances, the metal layer 245 may be coupled to the one or more interconnects. The one or more interconnects may be coupled to one or more active devices (e.g., transistors). A back end of line (BEOL) process may be used to fabricate the one or more interconnects and one or more dielectric layers.

The integrated device 404 is coupled to the frontside of the metallization portion 211 of the package 400. For example, the integrated device 404 may be coupled to a frontside of the metallization layer interconnect 203 through a plurality of solder interconnects 230. The frontside of the integrated device 404 may face the frontside of the metallization portion 211 (e.g., frontside of the at least one metallization layer interconnect 203). The plurality of solder interconnects 230 is coupled to the plurality of pillar interconnects 247 and the metallization layer interconnect 203. In some implementations, the plurality of pillar interconnects 247 may touch the metallization layer interconnect 203. An underfill 208 is located between the integrated device 404 and the metallization portion 211. For example, the underfill 208 may be located between (i) the integrated device 404 and (ii) the metallization layer interconnect 203, the passivation layer 210 and/or the passivation layer 212. The underfill 208 may laterally surround the plurality of pillar interconnects 247. In some implementations, the underfill 208 may include the same material or include a different material than the encapsulation layer 206.

As shown in FIG. 4, the integrated device 404 does not vertically overlap with the integrated device 402. Moreover, none of the plurality of pillar interconnect 247 (e.g., second pillar interconnect) of the integrated device 404 vertically overlaps with the plurality of pillar interconnects 227 (e.g., first pillar interconnect) of the integrated device 402.

A first pillar interconnect (from a plurality of pillar interconnects 227) may be coupled to a backside of a particular metallization layer interconnect 203, and a second pillar interconnect (e.g., from a plurality of pillar interconnects 247) may be coupled to a frontside of the particular metallization layer interconnect 203.

The integrated device 402 may be configured to be electrically coupled to the integrated device 404 through the at least one metallization layer interconnect 203. For example, the integrated device 402 may be configured to be electrically coupled to the integrated device 404 through the metal layer 225, the pillar interconnect 227, the metallization layer interconnect 203, the solder interconnect 230, the pillar interconnect 247 and the metal layer 245.

The package 400 may be configured to allow one or more electrical currents to travel to/from the integrated device 402 through the solder interconnect 209, the package pillar interconnect 207, the UBM interconnect 205, the metallization layer interconnect 203, the pillar interconnect 227 and the metal layer 225.

The package 400 may be configured to allow one or more electrical currents to travel to/from the integrated device 404 through the solder interconnect 209, the package pillar interconnect 207, the UBM interconnect 205, the metallization layer interconnect 203, the solder interconnect 230, the pillar interconnect 247 and the metal layer 245.

Figure 5:
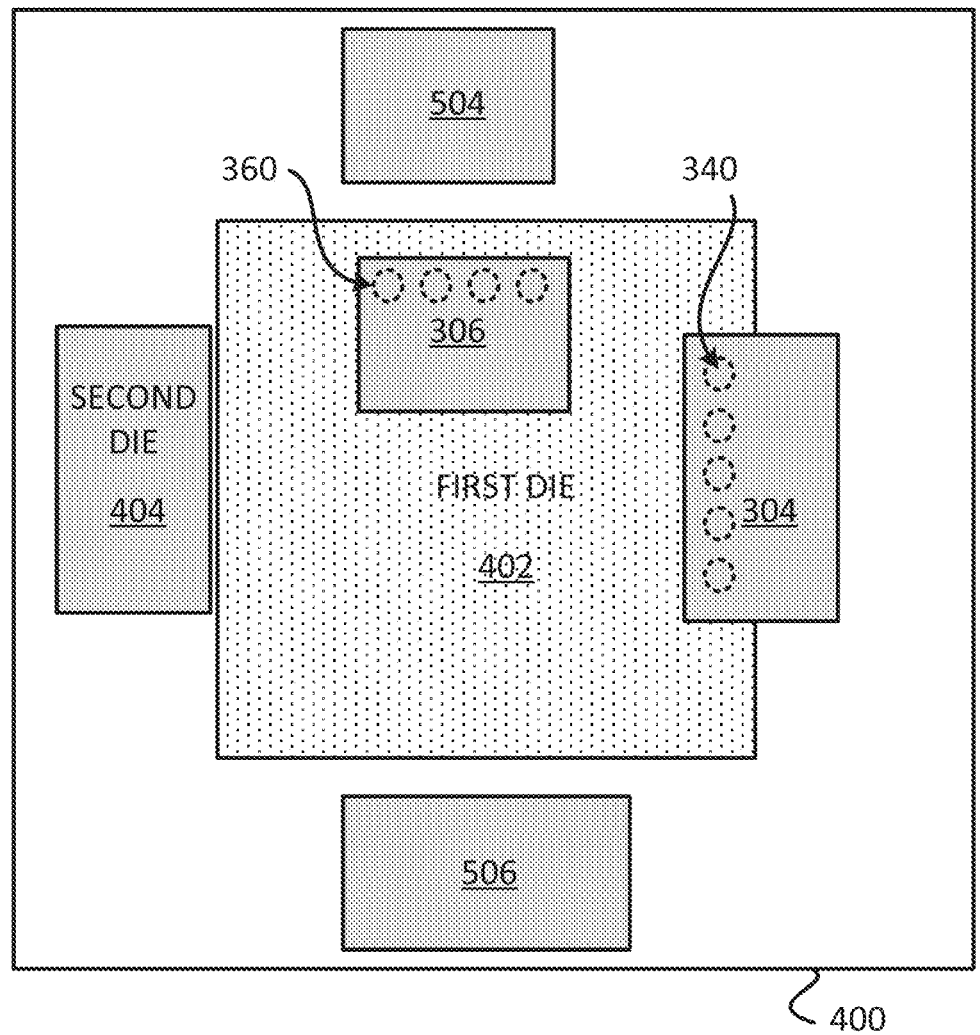
FIG. 5 illustrates a plan view of an exemplary package that includes integrated devices and a metallization portion.

FIG. 5 illustrates a plan view of the package 400 that includes the integrated device 402, the integrated device 404, the integrated device 304, the integrated device 306, an integrated device 504 and an integrated device 506. FIG. 5 illustrates how different integrated devices may vertically overlap or not vertically overlap with another integrated device. As shown in FIG. 5, the integrated device 304 and the integrated device 306 each vertically overlap with the integrated device 402. However, the integrated device 404, the integrated device 504 and the integrated device 506 do not vertically overlap with the integrated device 402. The frontside of the integrated device 404, the integrated device 304, the integrated device 306, the integrated device 504 and the integrated device 506, each face the frontside of the integrated device 402. FIG. 5 also illustrates different overlap areas (e.g., 340, 360) of pillar interconnects between different integrated devices. It is noted that the overlap areas shown in FIG. 5 are not intended to show all the possible overlaps of pillar interconnects between different integrated devices. In some implementations, there may be more or less overlap areas between different pillar interconnects of different integrated devices. It is noted that the overlap areas are exemplary. Different implementations may have different overlap areas.

The integrated device 404 does not vertically overlap with the integrated device 402. The integrated device 504 does not vertically overlap with the integrated device 402. The integrated device 506 does not vertically overlap with the integrated device 402. The integrated device 304 partially overlaps vertically with the integrated device 402. In some implementations, at least one pillar interconnect of the integrated device 304 at least partially overlaps vertically with at least one pillar interconnect of the integrated device 402. The integrated device 306 vertically overlaps with the integrated device 402. In some implementations, at least one pillar interconnect of the integrated device 306 at least vertically overlaps with at least one pillar interconnect of the integrated device 402.

An integrated device (e.g., 202, 204, 304, 306, 402, 404, 504, 506) may include a die (e.g., bare die). Any of the integrated devices described in the disclosure may have a structure similar to what is described for the integrated devices 202, 204, 402 and/or 404. The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

Figure 6:
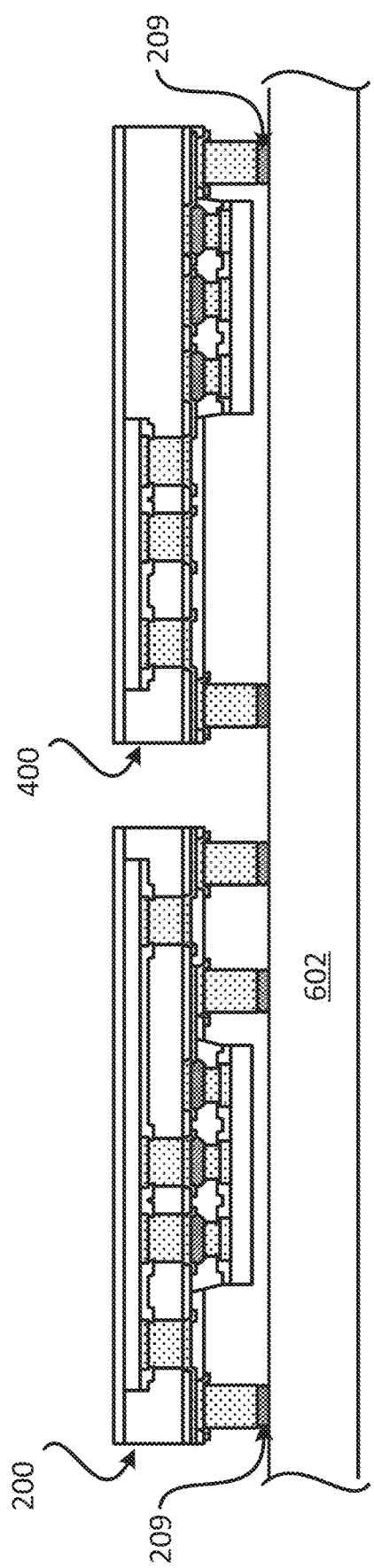
FIG. 6 illustrates packages coupled to a board.

FIG. 6 illustrates the package 200 and the package 400 coupled to a board 602. The package 200 is coupled to the board 602 through the plurality of solder interconnects 209. Similarly, the package 400 is coupled to the board 602 through the plurality of solder interconnects 209. The board 602 may include a printed circuit board (PCB). The board 602 may include an interposer.

Having described various packages, a sequence and process for fabricating a package will be described below.

Exemplary Sequence for Fabricating a Package Comprising Integrated Devices Coupled Through a Metallization Layer In some implementations, fabricating a package includes several processes. FIGS. 7A-7E illustrate an exemplary sequence for providing or fabricating a package. In some implementations, the sequence of FIGS. 7A-7E may be used to provide or fabricate the package 200 of FIGS. 2-3 and/or other packages described in the present disclosure.

It should be noted that the sequence of FIGS. 7A-7E may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 7A:
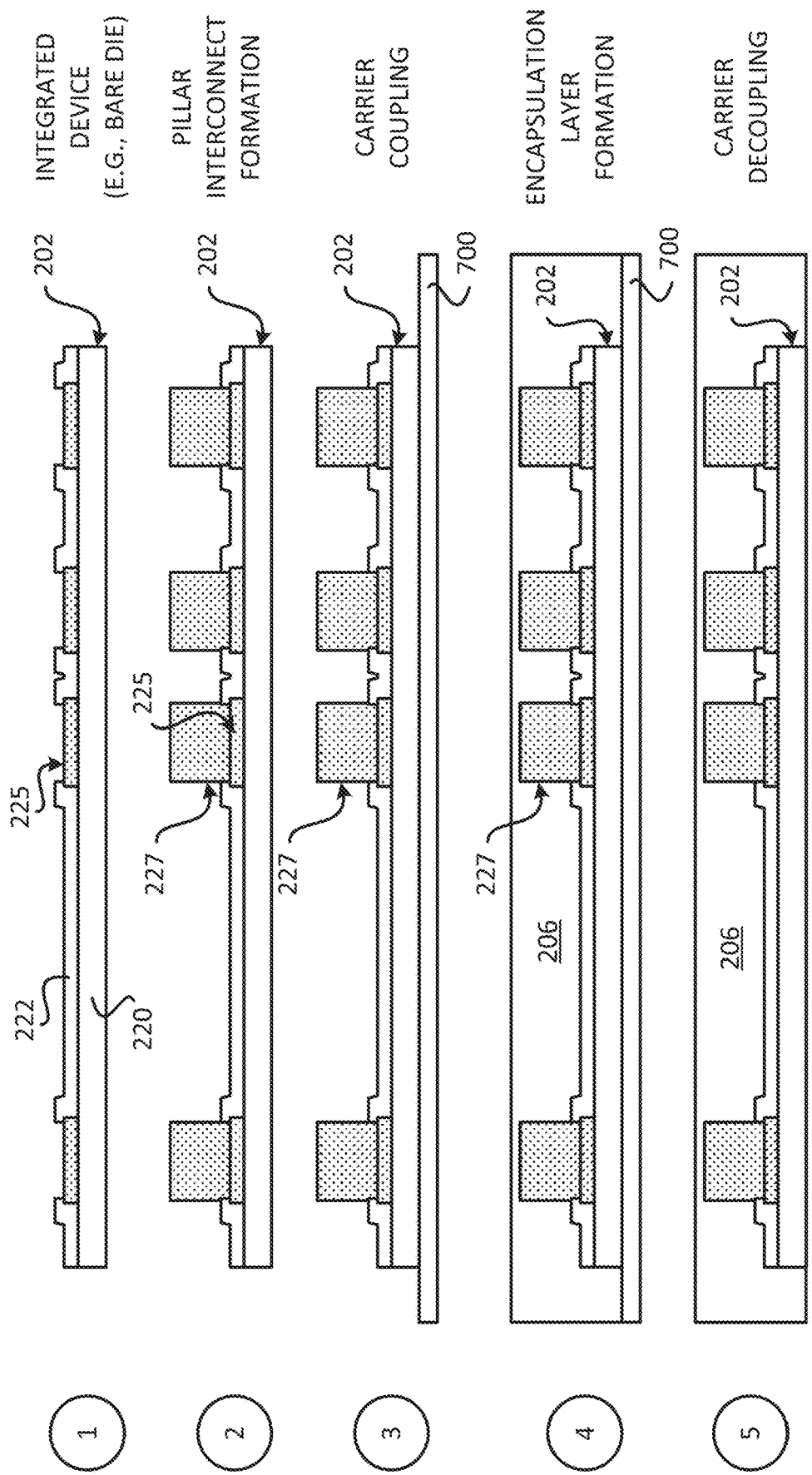

Stage 1, as shown in FIG. 7A, illustrates a state after an integrated device 202 (e.g., first integrated device) is provided. The integrated device 202 may include the die substrate 220, the metal layer 225 and the passivation layer 222. The integrated device 202 may include a die (e.g., bare die, first die). In some implementations, a front end of line (FEOL) process may be used to fabricate the integrated device 202 or part of the integrated device 202.

Stage 2 illustrates a state after the plurality of pillar interconnects 227 is formed over the integrated device 202. The plurality of pillar interconnects 227 (e.g., first plurality of pillar interconnects) may be considered part of the integrated device 202. The plurality of pillar interconnects 227 may be formed over the metal layer 225. A plating process may be used to form the plurality of pillar interconnects 227.

Stage 3 illustrates a state after the integrated device 202 is coupled to a carrier 700. Different implementations may use different materials for the carrier 700.

Stage 4 illustrates a state after an encapsulation layer 206 is formed over the carrier 700 and the integrated device 202. The encapsulation layer 206 may include a mold, a resin, an epoxy and/or polymer. The encapsulation layer 206 may be a means for encapsulation. The process of forming and/or disposing the encapsulation layer 206 may include using a compression and transfer molding process, a sheet molding process, or a liquid molding process.

Stage 5 illustrates a state after the carrier 700 is decoupled from the integrated device 202 and the encapsulation layer 206. The carrier 700 may be removed, grinded off and/or peeled off from the integrated device 202 and the encapsulation layer 206.

Figure 7B:
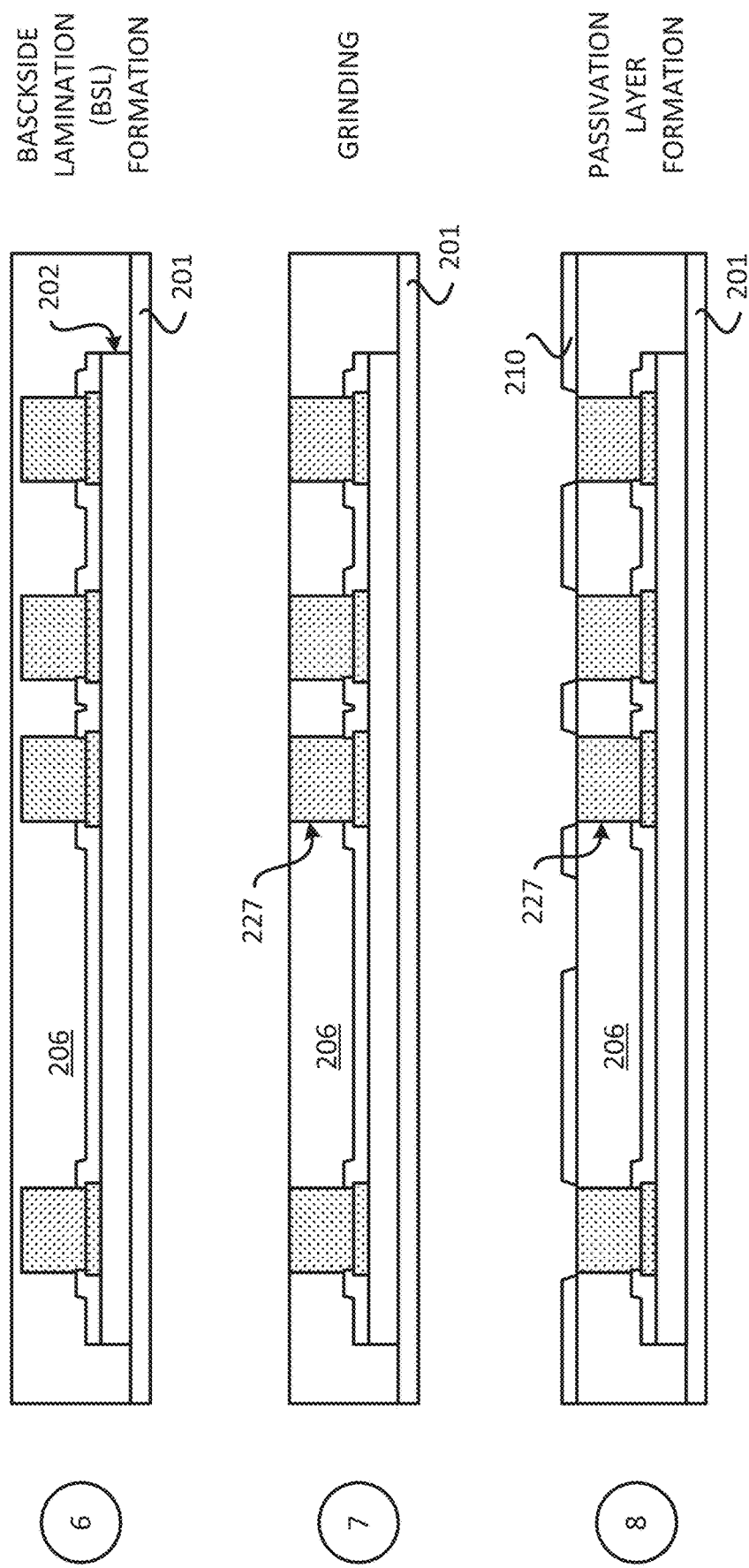

Stage 6, as shown in FIG. 7B, illustrates a state after a backside lamination layer 201 is formed over the backside of the integrated device 202 and a surface (e.g., bottom surface) of the encapsulation layer 206. A deposition and/or lamination process may be used to form the backside lamination layer 201. The backside lamination layer 201 may be optional.

Stage 7 illustrates a state after portions of the encapsulation layer 206 and/or portions of the plurality of pillar interconnects 227 are removed. A grinding process and/or polishing process may be used to removed portions of the encapsulation layer 206 and/or portions of the plurality of pillar interconnects 227. After the grinding process and/or polishing process, a surface (e.g., top surface) of the encapsulation layer 206 may be planar with a surface (e.g., top surface) of the plurality of pillar interconnects 227.

Stage 8 illustrates a state after a passivation layer 210 is formed over the encapsulation layer 206. A deposition process may be used to form the passivation layer 210. The passivation layer 210 may include opening(s) over the plurality of pillar interconnects 227.

Stage 9, as shown in FIG. 7C, illustrates a state after the metallization layer interconnect 203 is formed over the plurality of pillar interconnects 227 and the passivation layer 210.

The metallization layer interconnect 203 may include a plurality of redistribution layer interconnects. The metallization layer interconnect 203 may include redistribution layer interconnects that include U-shape interconnects or V-shape interconnects. A deposition process (e.g., plating process) may be used to form the metallization layer interconnect 203. Forming the metallization layer interconnect 203 may include forming a seed layer, performing a lithography process, a plating process, a stripping process and/or an etching process.

Stage 10 illustrates a state after a passivation layer 212 is formed over the metallization layer interconnect 203 and the passivation layer 210. A deposition process may be used to form the passivation layer 212. The passivation layer 212 may include opening(s) over the metallization layer interconnect 203. It is noted that Stages 9-10 may be iteratively repeated to form additional metallization layer interconnects and passivation layers.

Stage 11 illustrates a state after the plurality of UBM interconnects 205 is formed over the metallization layer interconnect 203 and the passivation layer 212. The plurality of UBM interconnects 205 may include U-shape or V-shape interconnects (e.g., interconnect with U-shape or V-shape profile cross section). A deposition process (e.g., plating process) may be used to form the plurality of UBM interconnects 205. The plurality of UBM interconnects 205 may be coupled (e.g., electrically coupled) to the metallization layer interconnect 203. Forming the plurality of UBM interconnects 205 may include forming a seed layer, performing a lithography process, a plating process, a stripping process and/or an etching process.

Figure 7D:
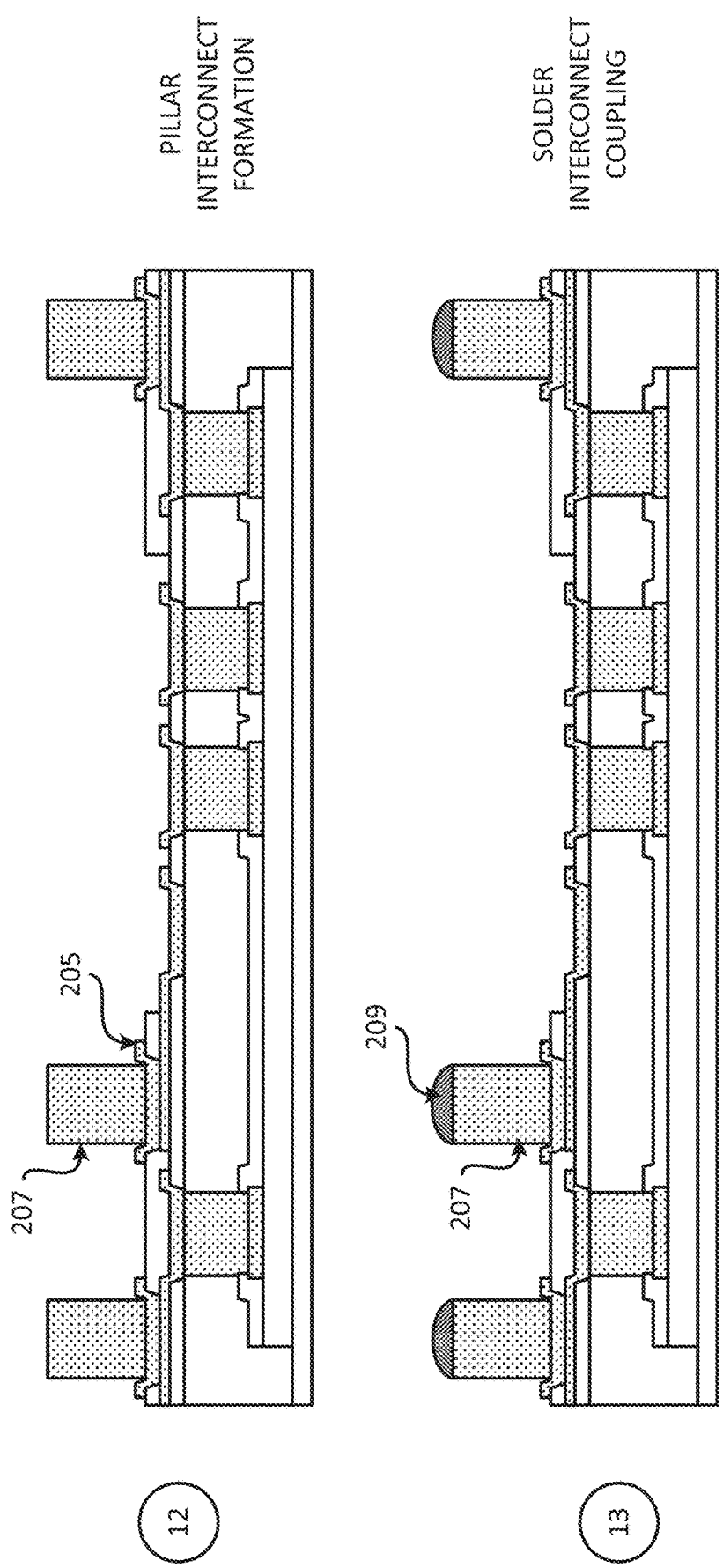

Stage 12, as shown in FIG. 7D, illustrates a state after the plurality of package pillar interconnects 207 is formed over the plurality of UBM interconnects 205. The plurality of package pillar interconnects 207 may be considered part of a package. A plating process may be used to form the plurality of package pillar interconnects 207.

Stage 13 illustrates a state after a plurality of solder interconnects is coupled to the plurality of package pillar interconnects 207. A reflow solder process may be used to couple the plurality of solder interconnects 209 to the plurality of package pillar interconnects 207.

Stage 14, as shown in FIG. 7E, illustrates a state after an integrated device 204 is coupled to a metallization portion 211. The integrated device 204 (e.g., second integrated device) may include a die (e.g., bare semiconductor die). The integrated device 204 includes a die substrate 240, a passivation layer 242, a metal layer 245, and a plurality of pillar interconnects 247, as described in at least FIG. 2. The integrated device 204 is coupled to the metallization layer interconnect 203 through the plurality of solder interconnects 230. In some implementations, the plurality of pillar interconnects 247 may touch the metallization layer interconnect 203. The integrated device 204 may be provided and/or fabricated in a similar manner as described in Stages 1-2 of FIG. 7A for the integrated device 202.

As shown at Stage 14, the integrated device 204 at least partially overlaps vertically with the integrated device 202. The front side of the integrated device 202 may face the front side of the integrated device 204. The pillar interconnect 247a (e.g., second pillar interconnect) of the integrated device 204 may vertically overlap with the pillar interconnect 227a (e.g., first pillar interconnect) of the integrated device 202. Similarly, the pillar interconnect 247b of the integrated device 204 may vertically overlap with the pillar interconnect 227b of the integrated device 202.

The plurality of pillar interconnects 227 may be arranged in rows of pillar interconnects and/or columns of pillar interconnects. The plurality of pillar interconnects 247 may be arranged in rows of pillar interconnects and/or columns of pillar interconnects. It is noted that rows of pillar interconnects may be used interchangeably with a column of pillar interconnects. In some implementations, at least two second pillar interconnects from a row second pillar interconnects (e.g., 247) vertically overlaps with at least two first pillar interconnects from a row of first pillar interconnects (e.g., 227).

A first pillar interconnect (from a plurality of pillar interconnects 227) may be coupled to a backside of a particular metallization layer interconnect 203, and a second pillar interconnect (e.g., from a plurality of pillar interconnects 247) may be coupled to a frontside of the particular metallization layer interconnect 203.

Stage 15 illustrates a state after the underfill 208 is provided. The underfill 208 is located between the integrated device 204 and the metallization portion 211. For example, the underfill 208 may be located between (i) the integrated device 204 and (ii) the metallization layer interconnect 203, the passivation layer 210 and/or the passivation layer 212. The underfill 208 may laterally surround the plurality of pillar interconnects 247. Stage 15 may illustrate the package 200, as described in FIG. 2.

Exemplary Sequence for Fabricating a Package Comprising Integrated Devices Coupled Through a Metallization Layer In some implementations, fabricating a package includes several processes. FIGS. 8A-8E illustrate an exemplary sequence for providing or fabricating a package. In some implementations, the sequence of FIGS. 8A-8E may be used to provide or fabricate the package 400 of FIGS. 4-5 and/or other packages described in the present disclosure.

It should be noted that the sequence of FIGS. 8A-8E may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 8A:
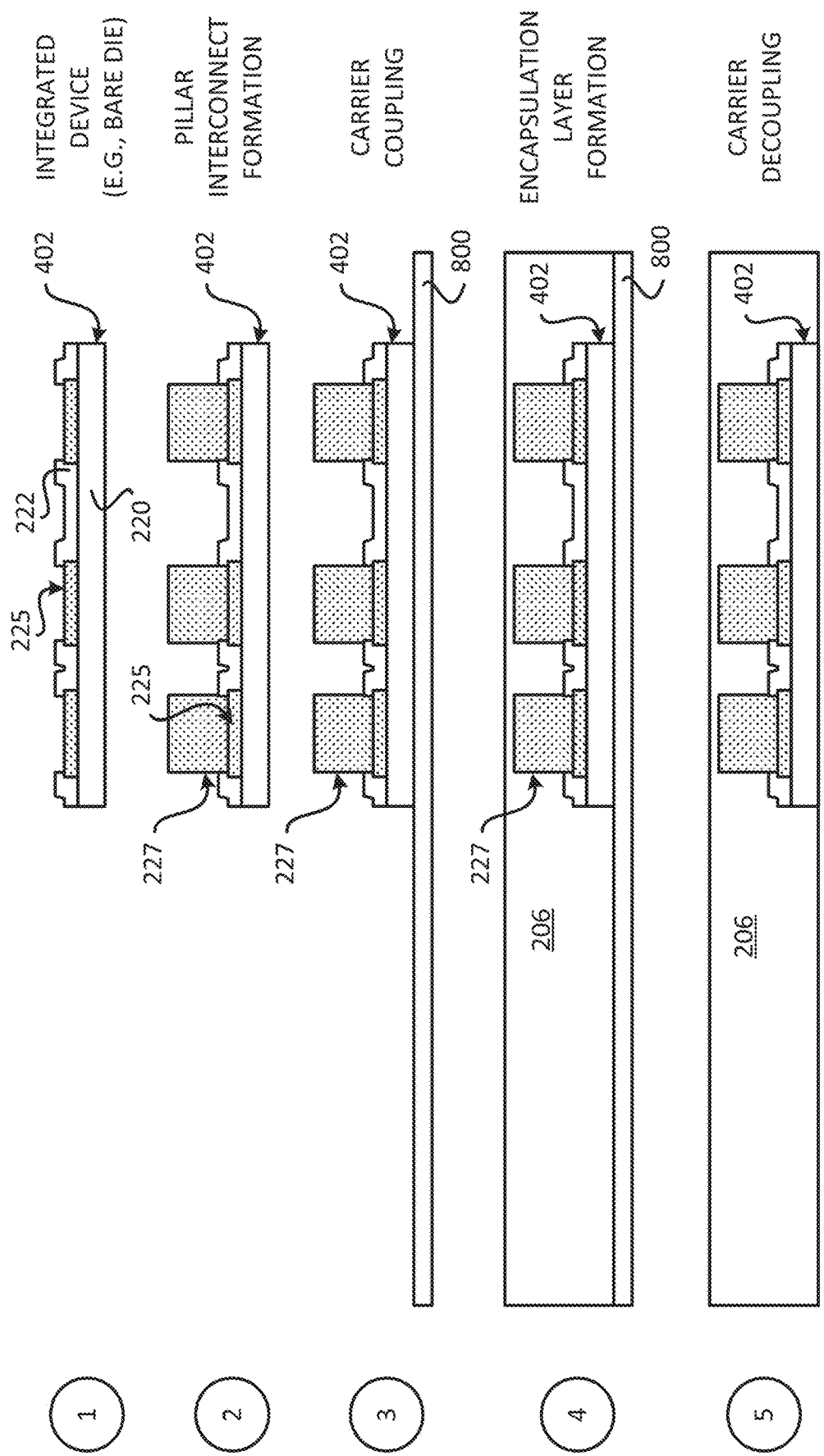
FIGS. 8A-8E illustrate an exemplary sequence for fabricating a package that includes integrated devices and a metallization portion.

Stage 1, as shown in FIG. 8A, illustrates a state after an integrated device 402 (e.g., first integrated device) is provided. The integrated device 402 may include the die substrate 220, the metal layer 225 and the passivation layer 222. The integrated device 402 may include a die (e.g., bare die, first die). In some implementations, a front end of line (FEOL) process may be used to fabricate the integrated device 402 or part of the integrated device 402.

Stage 2 illustrates a state after the plurality of pillar interconnects 227 is formed over the integrated device 402. The plurality of pillar interconnects 227 (e.g., first plurality of pillar interconnects) may be considered part of the integrated device 402. The plurality of pillar interconnects 227 may be formed over the metal layer 225. A plating process may be used to form the plurality of pillar interconnects 227.

Stage 3 illustrates a state after the integrated device 402 is coupled to a carrier 800. Different implementations may use different materials for the carrier 800.

Stage 4 illustrates a state after an encapsulation layer 206 is formed over the carrier 800 and the integrated device 402. The encapsulation layer 206 may include a mold, a resin, an epoxy and/or polymer. The encapsulation layer 206 may be a means for encapsulation. The process of forming and/or disposing the encapsulation layer 206 may include using a compression and transfer molding process, a sheet molding process, or a liquid molding process.

Stage 5 illustrates a state after the carrier 800 is decoupled from the integrated device 402 and the encapsulation layer 206. The carrier 800 may be removed, grinded off and/or peeled off from the integrated device 402 and the encapsulation layer 206.

Figure 8B:
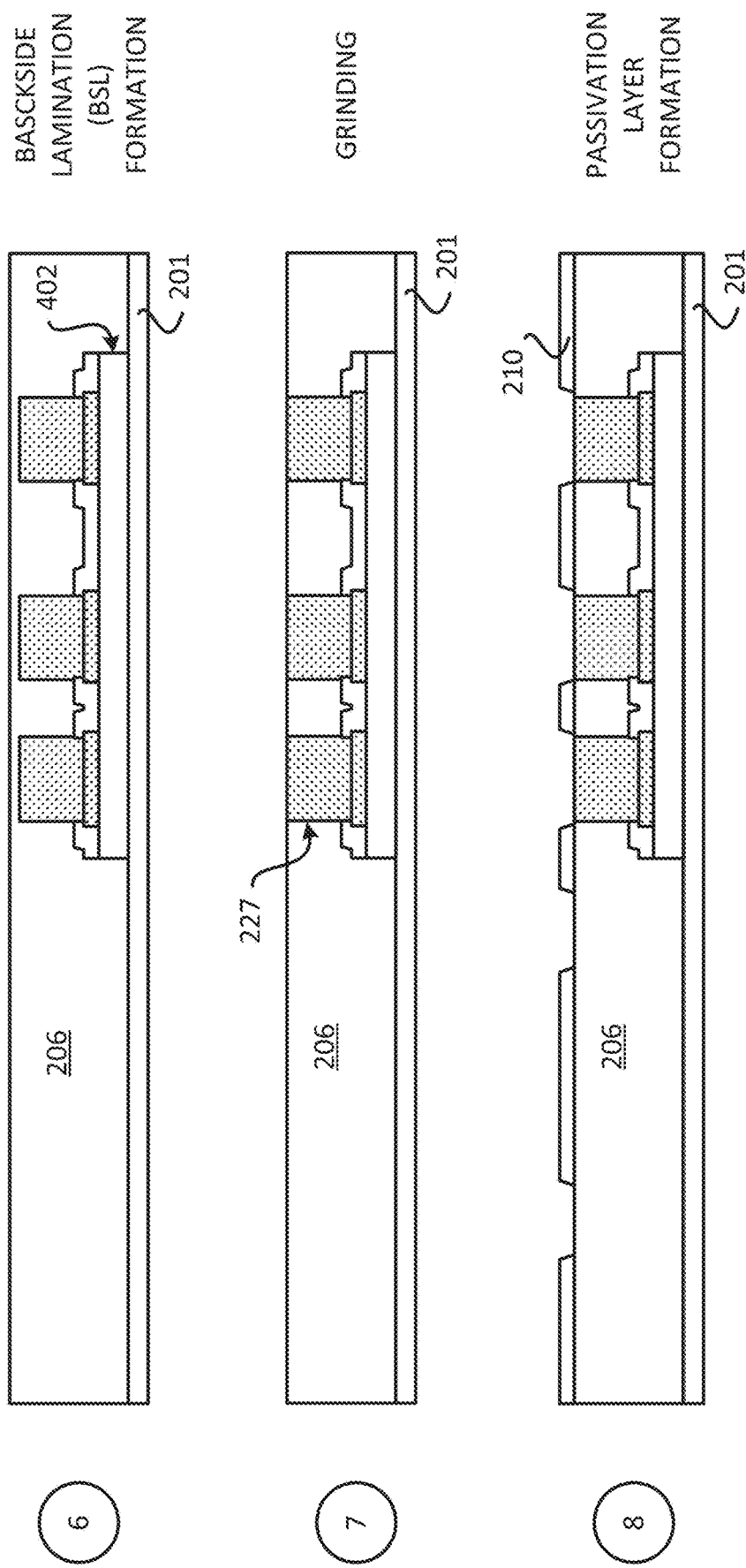

Stage 6, as shown in FIG. 8B, illustrates a state after a backside lamination layer 201 is formed over the backside of the integrated device 402 and a surface (e.g., bottom surface) of the encapsulation layer 206. A deposition and/or lamination process may be used to form the backside lamination layer 201. The backside lamination layer 201 may be optional.

Stage 7 illustrates a state after portions of the encapsulation layer 206 and/or portions of the plurality of pillar interconnects 227 are removed. A grinding process and/or polishing process may be used to removed portions of the encapsulation layer 206 and/or portions of the plurality of pillar interconnects 227. After the grinding process and/or polishing process, a surface (e.g., top surface) of the encapsulation layer 206 may be planar with a surface (e.g., top surface) of the plurality of pillar interconnects 227.

Stage 8 illustrates a state after a passivation layer 210 is formed over the encapsulation layer 206. A deposition process may be used to form the passivation layer 210. The passivation layer 210 may include opening(s) over the plurality of pillar interconnects 227.

Figure 8C:
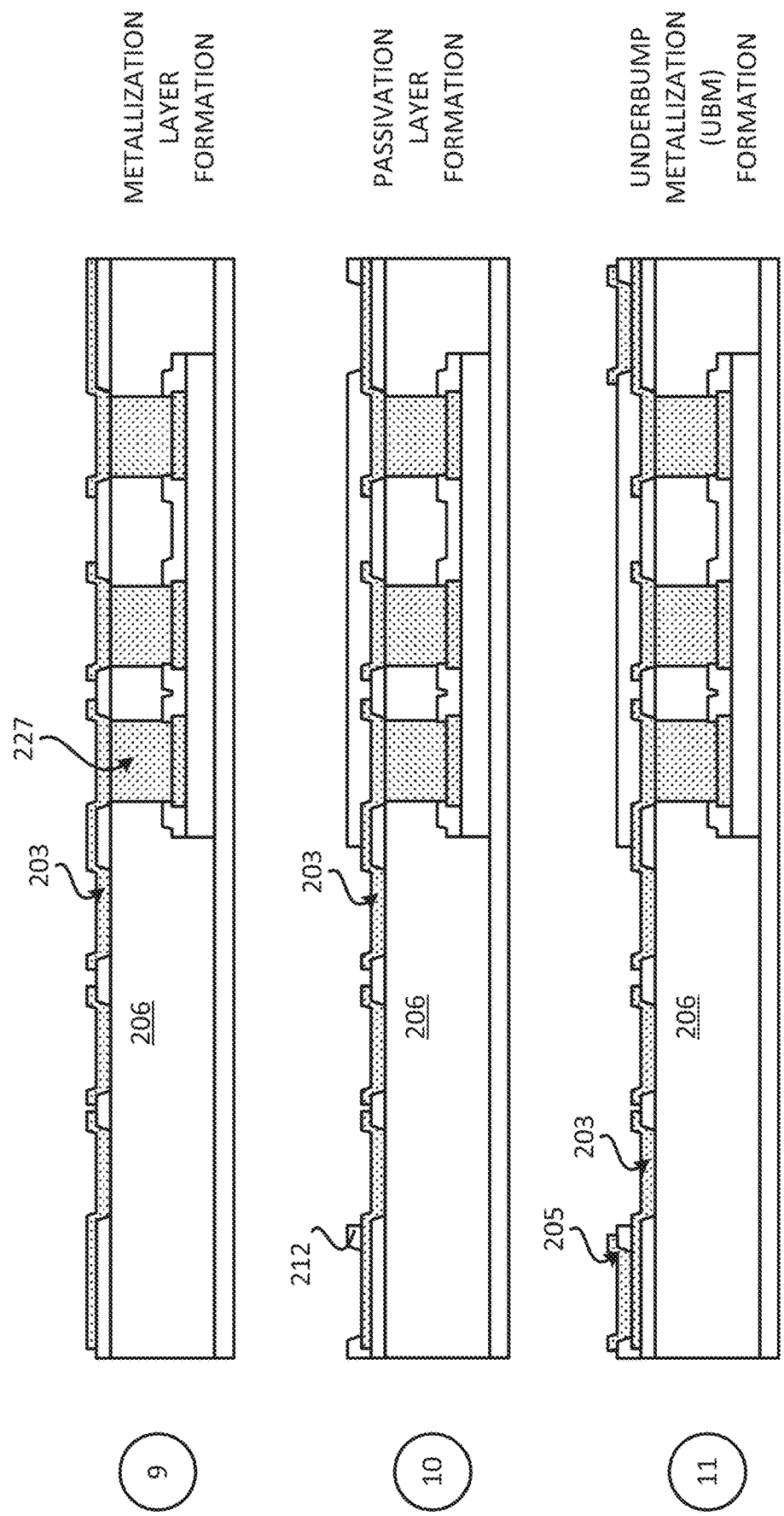

Stage 9, as shown in FIG. 8C, illustrates a state after the metallization layer interconnect 203 is formed over the plurality of pillar interconnects 227 and the passivation layer 210.

The metallization layer interconnect 203 may include a plurality of redistribution layer interconnects. The metallization layer interconnect 203 may include redistribution layer interconnects that include U-shape interconnects or V-shape interconnects (e.g., interconnect that includes U-shape or V-shape profile cross section). A deposition process (e.g., plating process) may be used to form the metallization layer interconnect 203. Forming the metallization layer interconnect 203 may include forming a seed layer, performing a lithography process, a plating process, a stripping process and/or an etching process.

Stage 10 illustrates a state after a passivation layer 212 is formed over the metallization layer interconnect 203 and the passivation layer 210. A deposition process may be used to form the passivation layer 212. The passivation layer 212 may include opening(s) over the metallization layer interconnect 203. It is noted that Stages 9-10 may be iteratively repeated to form additional metallization layer interconnects and passivation layers.

Stage 11 illustrates a state after the plurality of UBM interconnects 205 is formed over the metallization layer interconnect 203 and the passivation layer 212. The plurality of UBM interconnects 205 may include U-shape or V-shape interconnects (e.g., interconnect that includes a U-shape or V-shape profile cross section). A deposition process (e.g., plating process) may be used to form the plurality of UBM interconnects 205. The plurality of UBM interconnects 205 may be coupled (e.g., electrically coupled) to the metallization layer interconnect 203. Forming the plurality of UBM interconnects 205 may include forming a seed layer, performing a lithography process, a plating process, a stripping process and/or an etching process.

Figure 8D:
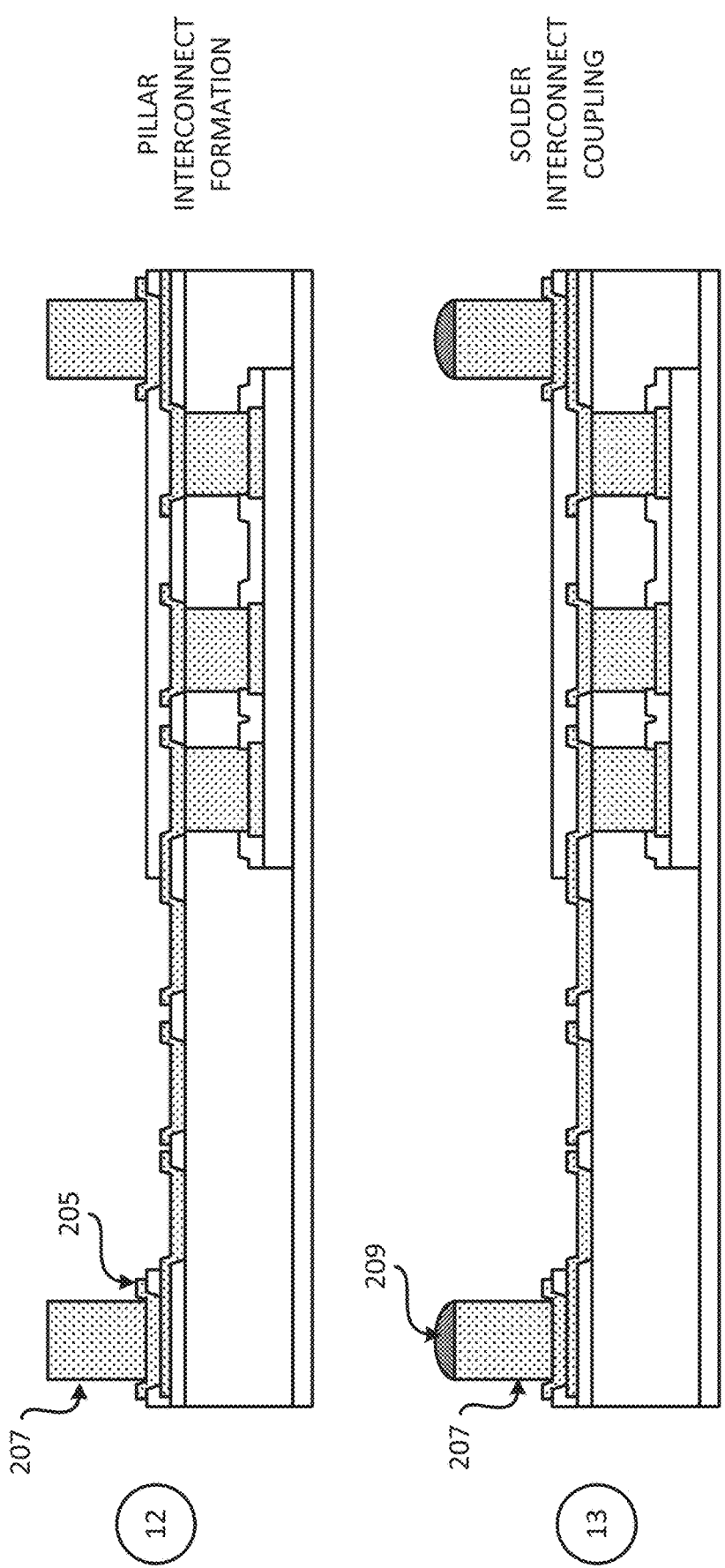

Stage 12, as shown in FIG. 8D, illustrates a state after the plurality of package pillar interconnects 207 is formed over the plurality of UBM interconnects 205. The plurality of package pillar interconnects 207 may be considered part of a package. A plating process may be used to form the plurality of package pillar interconnects 207.

Stage 13 illustrates a state after a plurality of solder interconnects 209 is coupled to the plurality of package pillar interconnects 207. A reflow solder process may be used to couple the plurality of solder interconnects 209 to the plurality of package pillar interconnects 207.

Figure 8E:
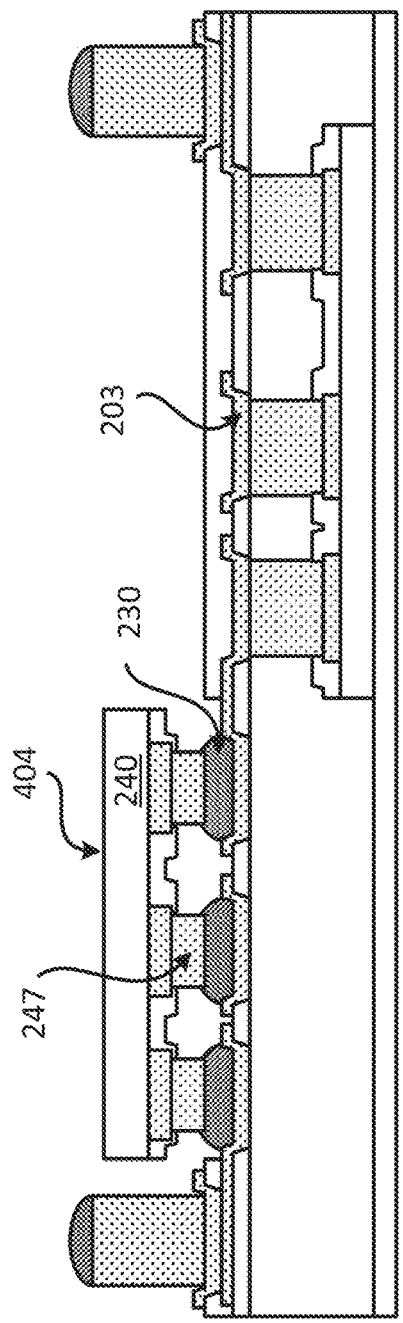
Figure 8E:
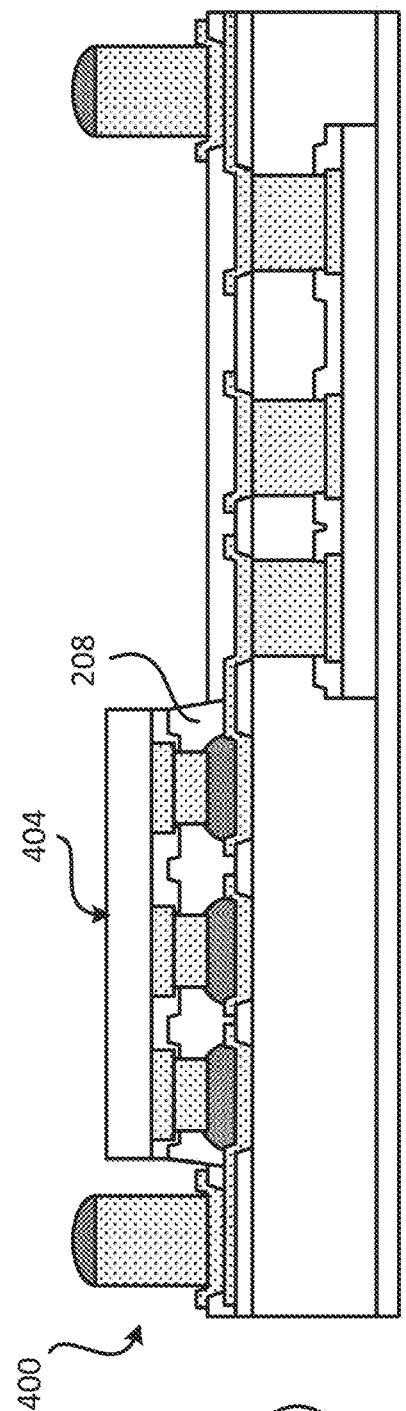

Stage 14, as shown in FIG. 8E, illustrates a state after an integrated device 404 is coupled to a metallization portion 211. The integrated device 404 (e.g., second integrated device) may include a die (e.g., bare semiconductor die). The integrated device 404 includes a die substrate 240, a passivation layer 242, a metal layer 245, and a plurality of pillar interconnects 247, as described in at least FIG. 4. The integrated device 404 is coupled to the metallization layer interconnect 203 through the plurality of solder interconnects 230. In some implementations, the plurality of pillar interconnects 247 may touch the metallization layer interconnect 203. The integrated device 404 may be provided and/or fabricated in a similar manner as described in Stages 1-2 of FIG. 8A for the integrated device 402.

As shown at Stage 14, the integrated device 404 does not vertically overlap with the integrated device 402. Moreover, none of the plurality of pillar interconnect 247 (e.g., second pillar interconnect) of the integrated device 404 vertically overlaps with the plurality of pillar interconnects 227 (e.g., first pillar interconnect) of the integrated device 402. A first pillar interconnect (from a plurality of pillar interconnects 227) may be coupled to a backside of a particular metallization layer interconnect 203, and a second pillar interconnect (e.g., from a plurality of pillar interconnects 247) may be coupled to a frontside of the particular metallization layer interconnect 203.

Stage 15 illustrates a state after the underfill 208 is provided. The underfill 208 is located between the integrated device 404 and the metallization portion 211. For example, the underfill 208 may be located between (i) the integrated device 404 and (ii) the metallization layer interconnect 203, the passivation layer 210 and/or the passivation layer 212.

The underfill 208 may laterally surround the plurality of pillar interconnects 247. Stage 15 may illustrate the package 400, as described in FIG. 4.

Figure 9A:
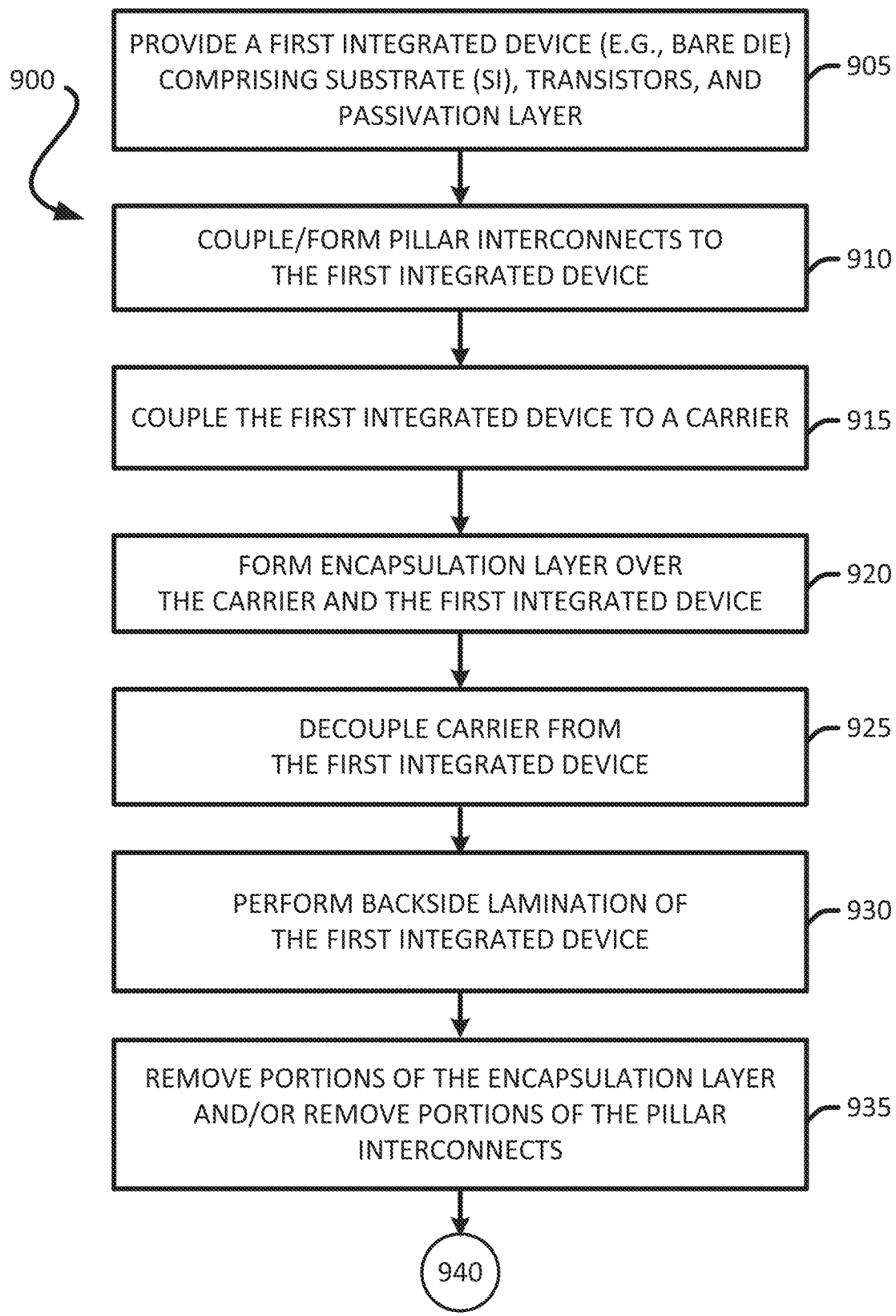
FIGS. 9A-9B illustrate an exemplary flow diagram of a method for fabricating a package that includes integrated devices and a metallization portion.
Figure 9B:
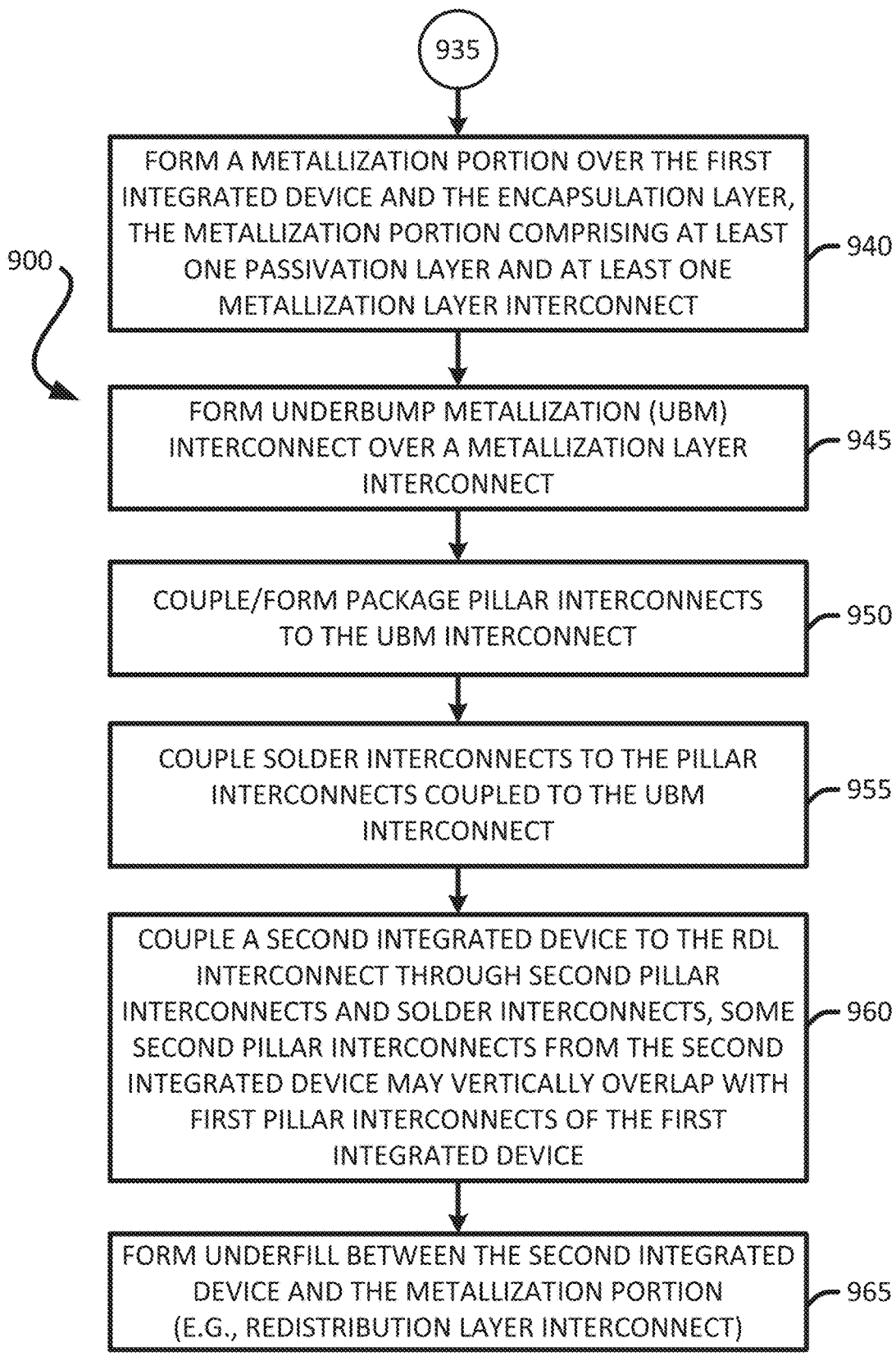

Exemplary Flow Diagram of a Method for Fabricating a Package Comprising Integrated Devices Coupled Through a Metallization Layer In some implementations, providing an integrated device coupled to an integrated passive device includes several processes. FIGS. 9A-9B illustrate an exemplary flow diagram of a method 900 for providing or fabricating a package. In some implementations, the method 900 of FIGS. 9A-9B may be used to provide or fabricate the packages of FIGS. 2-5 and/or other packages described in the present disclosure.

It should be noted that the method of FIGS. 9A-9B may combine one or more processes in order to simplify and/or clarify the method for providing or fabricating a package. In some implementations, the order of the processes may be changed or modified.

The method provides (at 905) a first integrated device (e.g., 202, 402). The first integrated device may include a die substrate 220, a metal layer 225 and a passivation layer 222. The first integrated device may include a die (e.g., bare die, first die). In some implementations, a front end of line (FEOL) process may be used to fabricate the first integrated device or part of the first integrated device. Stage 1 of FIG. 7A and Stage 1 of FIG. 8A illustrate examples of an integrated device.

The method forms (at 910) a plurality of pillar interconnects (e.g., 227) over the first integrated device (e.g., 202, 402). Forming pillar interconnects may include coupling pillar interconnects to the first integrated device. The plurality of pillar interconnects 227 (e.g., first plurality of pillar interconnects) may be considered part of the first integrated device. The plurality of pillar interconnects 227 may be formed over the metal layer 225. A plating process may be used to form the plurality of pillar interconnects 227. Stage 2 of FIG. 7A and Stage 2 of FIG. 8A illustrate examples of coupling pillar interconnects to an integrated device.

The method couples (at 915) the first integrated device (e.g., 202, 402) to a carrier (e.g., 700, 800). Different implementations may use different materials for the carrier. The backside of the first integrated device may be coupled to the carrier. Stage 3 of FIG. 7A and Stage 3 of FIG. 8A illustrate examples of coupling an integrated device to a carrier.

The method forms (at 920) an encapsulation layer (e.g., 206) over the carrier (e.g., 700, 800) and the first integrated device (e.g., 202, 402). The encapsulation layer 206 may include a mold, a resin, an epoxy and/or polymer. The encapsulation layer 206 may be a means for encapsulation. The process of forming and/or disposing the encapsulation layer 206 may include using a compression and transfer molding process, a sheet molding process, or a liquid molding process. Stage 4 of FIG. 7A and Stage 4 of FIG. 8A illustrate examples of forming an encapsulation layer.

The method decouples (at 925) the carrier (e.g., 700, 800) from the first integrated device (e.g., 202, 402) and the encapsulation layer (e.g., 206). The carrier may be removed, grinded off and/or peeled off from the first integrated device and the encapsulation layer. Stage 5 of FIG. 7A and Stage 5 of FIG. 8A illustrate examples of decoupling a carrier.

The method provides (at 930) a backside lamination layer (e.g., 201) over a backside of the first integrated device. The backside lamination layer 201 may be formed over the backside of the first integrated device (e.g., 202, 402) and a surface (e.g., bottom surface) of the encapsulation layer 206. A deposition and/or lamination process may be used to form the backside lamination layer 201. The backside lamination layer 201 may be optional. Stage 6 of FIG. 7B and Stage 6 of FIG. 8B illustrate examples of providing backside lamination layer.

The method removes (at 935) portions of the encapsulation layer 206 and/or portions of the plurality of pillar interconnects 227. A grinding process and/or polishing process may be used to removed portions of the encapsulation layer 206 and/or portions of the plurality of pillar interconnects 227. After the grinding process and/or polishing process, a surface (e.g., top surface) of the encapsulation layer 206 may be planar with a surface (e.g., top surface) of the plurality of pillar interconnects 227. Stage 7 of FIG. 7B and Stage 7 of FIG. 8B illustrate examples of removing portions of an encapsulation layer and portions of pillar interconnects.

The method forms (at 940) a metallization portion 211 over the first integrated device (e.g., 202, 402) and the encapsulation layer 206. The metallization portion 211 may include a redistribution portion. The metallization portion may include at least one passivation layer (e.g., 210, 212) and a metallization layer interconnect (e.g., 203). Forming the metallization portion may include forming a passivation layer 210 over the encapsulation layer 206. A deposition process may be used to form the passivation layer 210. The passivation layer 210 may include opening(s) over the plurality of pillar interconnects 227. Forming the metallization portion may include forming the metallization layer interconnect 203 over the plurality of pillar interconnects 227 and the passivation layer 210. The metallization layer interconnect 203 may include a plurality of redistribution layer interconnects. The metallization layer interconnect 203 may include redistribution layer interconnects that include U-shape interconnects or V-shape interconnects (e.g., interconnects that include a U-shape or a V-shape profile cross section). A deposition process (e.g., plating process) may be used to form the metallization layer interconnect 203. Forming the metallization layer interconnect 203 may include forming a seed layer, performing a lithography process, a plating process, a stripping process and/or an etching process. Forming the metallization portion may include forming a passivation layer 212 over the metallization layer interconnect 203 and the passivation layer 210. A deposition process may be used to form the passivation layer 212. The passivation layer 212 may include opening(s) over the metallization layer interconnect 203. It is noted that the metallization portion may include several layers of the metallization layer interconnects and several passivation layers. Stages 8-10 of FIGS. 7B-7C and Stages 8-10 of FIGS. 8B-8C illustrate examples of forming a metallization portion.

The method forms (at 945) a plurality of UBM interconnects 205 over the metallization layer interconnect 203 and the passivation layer 212. The plurality of UBM interconnects 205 may include U-shape or V-shape interconnects (e.g., interconnects that include a U-shape or a V-shape profile cross section). A deposition process (e.g., plating process) may be used to form the plurality of UBM interconnects 205. The plurality of UBM interconnects 205 may be coupled (e.g., electrically coupled) to the metallization layer interconnect 203. Forming the plurality of UBM interconnects 205 may include forming a seed layer, performing a lithography process, a plating process, a stripping process and/or an etching process. Stage 11 of FIG. 7C and Stage 11 of FIG. 8C illustrate examples of forming a UBM interconnects.

The method forms (at 950) a plurality of package pillar interconnects 207 over the plurality of UBM interconnects 205. The plurality of package pillar interconnects 207 may be coupled to the plurality of UBM interconnects 205. The plurality of package pillar interconnects 207 may be considered part of a package. A plating process may be used to form the plurality of package pillar interconnects 207. Stage 12 of FIG. 7D and Stage 12 of FIG. 8D illustrate examples of forming package pillar interconnects.

The method couples (at 955) a plurality of solder interconnects 209 to the plurality of package pillar interconnects 207. A reflow solder process may be used to couple the plurality of solder interconnects 209 to the plurality of package pillar interconnects 207. Stage 13 of FIG. 7D and Stage 13 of FIG. 8D illustrate examples of coupling solder interconnects.

The method couples (at 960) a second integrated device (e.g., 204, 404) to a metallization portion 211. The second integrated device (e.g., 204, 404) may include a die (e.g., bare semiconductor die). The second integrated device (e.g., 204, 404) includes a die substrate 240, a passivation layer 242, a metal layer 245, and a plurality of pillar interconnects 247, as described in at least FIGS. 2 and 4. The second integrated device (e.g., 204, 404) is coupled to the metallization layer interconnect 203 through the plurality of solder interconnects 230. In some implementations, the plurality of pillar interconnects 247 may touch the metallization layer interconnect 203. The second integrated device (e.g., 204, 404) may be provided and/or fabricated in a similar manner as described in Stages 1-2 of FIG. 7A and FIG. 8A for the first integrated device (e.g., 202, 402). Other integrated devices (e.g., 304, 306, 504, 506) may be coupled to the metallization portion 211.

A reflow solder process may be used to couple the second integrated devices to the metallization portion 211 (e.g., metallization layer interconnect 203) through a plurality of solder interconnects 230.

In some implementations, the second integrated device (and other integrated devices) may be coupled such that the second integrated device (e.g., 204, 404) at least partially overlaps vertically with the first integrated device (e.g., 202, 402). The front side of the first integrated device may face the front side of the second integrated device. In some implementations, the second integrated device (and other integrated devices) may be coupled such that the second integrated device (e.g., 204, 404) does not overlap vertically with the first integrated device (e.g., 202, 402). The front side of the first integrated device may face the front side of the second integrated device. Examples of how various integrated devices may or may not overlap vertically with each other are illustrated and described in at least FIGS. 2-5. Stage 14 of FIG. 7E and Stage 14 of FIG. 8E illustrate examples of coupling integrated devices.

The method forms (at 965) an underfill 208. The underfill 208 may be formed and located between the second integrated device (e.g., 204, 404) and the metallization portion 211. For example, the underfill 208 may be located between (i) the second integrated device (e.g., 204, 404) and (ii) the metallization layer interconnect 203, the passivation layer 210 and/or the passivation layer 212. The underfill 208 may laterally surround the plurality of pillar interconnects 247. Stage 15 of FIG. 7E and Stage 15 of FIG. 8E illustrate examples of forming an underfill.

Exemplary Electronic Devices

Figure 10:
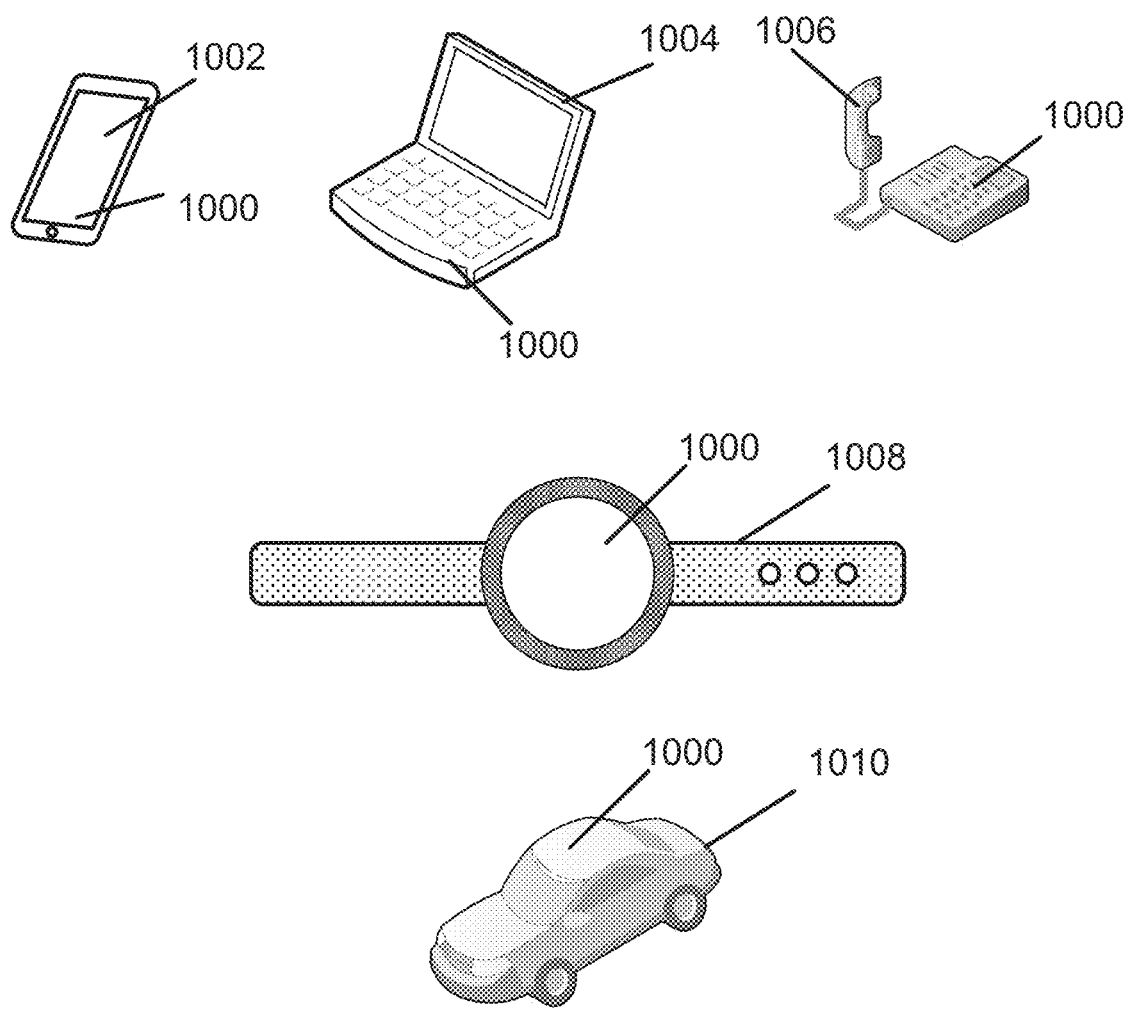
FIG. 10 illustrates various electronic devices that may integrate a die, an integrated device, an integrated passive device (IPD), a device package, a package, an integrated circuit and/or PCB described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7E, 8A-8E, 9A-9B, and 10 may be rearranged and/or combined into a single component, process, feature or function or embodied in several components, processes, or functions. Additional elements, components, processes, and/or functions may also be added without departing from the disclosure. It should also be noted FIGS. 2-6, 7A-7E, 8A-8E, 9A-9B, and 10 and its corresponding description in the present disclosure is not limited to dies and/or ICs. In some implementations, 2-6, 7A-7E, 8A-8E, 9A-9B, and 10 and its corresponding description may be used to manufacture, create, provide, and/or produce devices and/or integrated devices. In some implementations, a device may include a die (e.g., logic die), an integrated device, an integrated passive device (IPD) (e.g., passive die), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A package comprising a first integrated device comprising a plurality of first pillar interconnects; an encapsulation layer at least partially encapsulating the first integrated device; a metallization portion located over the first integrated device and the encapsulation layer, wherein the metallization portion includes at least one passivation layer and a plurality of metallization layer interconnects, wherein the plurality of first pillar interconnects is coupled to the plurality of metallization layer interconnects; and a second integrated device comprising a plurality of second pillar interconnects, wherein the second integrated device is coupled to the plurality of metallization layer interconnects through the plurality of second pillar interconnects and a plurality of solder interconnects.

Aspect 2: The package of aspect 1, wherein a second pillar interconnect from the plurality of the second pillar interconnects vertically overlaps with a first pillar interconnect from the plurality of the first pillar interconnects.

Aspect 3: The package of aspects 1 through 2, wherein at least two second pillar interconnects from a row second pillar interconnects from the plurality of second pillar interconnects vertically overlaps with at least two first pillar interconnects from a row of first pillar interconnects from the plurality of first pillar interconnects.

Aspect 4: The package of aspects 1 through 3, wherein a first pillar interconnect from the plurality of first pillar interconnects is coupled to a backside of a first metallization layer interconnect from the plurality of metallization layer interconnects, and wherein a second pillar interconnect from the plurality of second pillar interconnects is coupled to a frontside of the first metallization layer interconnect.

Aspect 5: The package of aspects 1 through 4, wherein the second integrated device at least partially overlaps vertically with the first integrated device.

Aspect 6: The package of aspects 1 through 5, wherein the plurality of first pillar interconnects is directly coupled to at least part of the plurality of metallization layer interconnects.

Aspect 7: The package of aspects 1 through 6, wherein the first integrated device is configured to be coupled to the second integrated device through the plurality of metallization layer interconnects. The first integrated device may be configured to be electrically coupled to the second integrated device through the plurality of metallization layer interconnects.

Aspect 8: The package of aspects 1 through 7, further comprising a plurality of under bump metallization (UBM) interconnects coupled to at least part of the plurality of metallization layer interconnects; and a plurality of package pillar interconnects coupled to the plurality of UBM interconnects.

Aspect 9: The package of aspects 1 through 8, wherein the plurality of metallization layer interconnects includes a plurality of redistribution layer (RDL) interconnects.

Aspect 10: The package of aspects 1 through 9, further comprising an underfill located between the second integrated device and the plurality of metallization layer interconnects.

Aspect 11: The package of aspects 1 through 10, wherein a frontside of the first integrated device faces the plurality of metallization layer interconnects, and wherein a frontside of the second integrated device faces the plurality of metallization layer interconnects.

Aspect 12: The package of aspects 1 through 11, wherein at least one metallization layer interconnect includes a side profile that includes a U-shape and/or a V-shape.

Aspect 13: The package of aspects 1 through 12, further comprising a backside lamination layer located over a backside of the first integrated device.

Aspect 14: The package of aspects 1 through 13, wherein the plurality of metallization layer interconnects includes one metal layer.

Aspect 15: The package of aspects 1 through 14, wherein the first integrated device includes a first bare semiconductor die, and wherein the second integrated device includes a second bare semiconductor die.

Aspect 16: An apparatus comprising a first integrated device comprising a plurality of first pillar interconnects; means for encapsulation at least partially encapsulating the first integrated device; a metallization portion located over the first integrated device and the means for encapsulation, wherein the metallization portion includes at least one passivation layer and means for metallization interconnection, wherein the plurality of first pillar interconnects is coupled to the means for metallization interconnection; and a second integrated device comprising a plurality of second pillar interconnects, wherein the second integrated device is coupled to the metallization interconnection through the plurality of second pillar interconnects and a plurality of solder interconnects.

Aspect 17: The apparatus of aspect 16, wherein a second pillar interconnect from the plurality of the second pillar interconnects vertically overlaps with a first pillar interconnect from the plurality of the first pillar interconnects.

Aspect 18: The apparatus of aspects 16 through 17, wherein at least two second pillar interconnects from a row second pillar interconnects from the plurality of second pillar interconnects vertically overlaps with at least two first pillar interconnects from a row of first pillar interconnects from the plurality of first pillar interconnects.

Aspect 19: The apparatus of aspects 16 through 18, wherein a first pillar interconnect from the plurality of first pillar interconnects is coupled to a backside of the means for metallization interconnection, and wherein a second pillar interconnect from the plurality of second pillar interconnects is coupled to a frontside of the means for metallization interconnection.

Aspect 20: The apparatus of aspects 16 through 19, wherein the second integrated device at least partially overlaps vertically with the first integrated device.

Aspect 21: The apparatus of aspects 16 through 20, wherein the plurality of first pillar interconnects is directly coupled to the means for metallization interconnection.

Aspect 22: The apparatus of aspects 16 through 21, wherein the first integrated device is configured to be coupled to the second integrated device through the means of metallization interconnection. The first integrated device may be configured to be electrically coupled to the second integrated device through the means of metallization interconnection.

Aspect 23: The apparatus of aspects 16 through 22, further comprising: a plurality of under bump metallization (UBM) interconnects coupled to the means for metallization interconnection; and a plurality of package pillar interconnects coupled to the plurality of UBM interconnects.

Aspect 24: The apparatus of aspects 16 through 23, further comprising an underfill located between the second integrated device and the means for metallization interconnection.

Aspect 25: The apparatus of aspects 16 through 24, wherein a frontside of the first integrated device faces the means for metallization interconnection, and wherein a frontside of the second integrated device faces the means for metallization interconnection.

Aspect 26: The apparatus of aspects 16 through 25, wherein the means for metallization interconnection includes at least one interconnect comprising a side profile that includes a U-shape and/or a V-shape.

Aspect 27: The apparatus of aspects 16 through 26, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Aspect 28: A method for fabricating a package. The method provides a first integrated device comprising a plurality of first pillar interconnects. The method forms an encapsulation layer over the first integrated device. The method forms a metallization portion over the first integrated device and the encapsulation layer. Forming the metallization portion includes forming at least one passivation layer and forming a plurality of metallization layer interconnects. The plurality of metallization layer interconnects is formed such that the plurality of metallization layer interconnects is coupled to the plurality of first pillar interconnects. The method couples a second integrated device to the plurality of metallization layer interconnects through a plurality of second pillar interconnects and a plurality of solder interconnects.

Aspect 29: The method of aspect 28, wherein at least one second pillar interconnect vertically overlaps with a first pillar interconnect.

Aspect 30: The method of aspects 28 through 29, wherein at least two second pillar interconnects from a row second pillar interconnects from the plurality of second pillar interconnects vertically overlaps with at least two first pillar interconnects from a row of first pillar interconnects from the plurality of first pillar interconnects.

Aspect 31: The method of aspects 28 through 30, wherein a first pillar interconnect from the plurality of first pillar interconnects is coupled to a backside of a first metallization layer interconnect, and wherein a second pillar interconnect from the plurality of second pillar interconnects is coupled to a frontside of the first metallization layer interconnect.

Aspect 32: The method of aspects 28 through 31, wherein the second integrated device at least partially overlaps vertically with the first integrated device.

Aspect 33: The method of aspects 28 through 32, wherein the plurality of first pillar interconnects is directly coupled to at least part of the plurality of metallization layer interconnects.

Aspect 34: The method of aspects 28 through 33, wherein the plurality of first pillar interconnects is coupled to a first side of the metallization portion, and wherein the plurality of second pillar interconnects is coupled to a second side of the metallization portion, wherein the second side is opposite to the first side.

Aspect 35: The method of aspects 28 through 33, wherein the plurality of first pillar interconnects is coupled to a first side of the plurality of metallization layer interconnects, and wherein the plurality of second pillar interconnects is coupled to a second side of the plurality of metallization layer interconnects, wherein the second side is opposite to the first side.

Aspect 36: The package of aspects 1 through 15, wherein the plurality of first pillar interconnects is coupled to a first side of the metallization portion, and wherein the plurality of second pillar interconnects is coupled to a second side of the metallization portion, wherein the second side is opposite to the first side.

Aspect 37: The package of aspects 1 through 15, wherein the plurality of first pillar interconnects is coupled to a first side of the plurality of metallization layer interconnects, and wherein the plurality of second pillar interconnects is coupled to a second side of the plurality of metallization layer interconnects, wherein the second side is opposite to the first side.

Aspect 38: The package of aspects 1 through 15 and 36 through 37, wherein the first integrated device and the second integrated device are coupled to the metallization portion such that a frontside of the first integrated device faces an opposite direction than a front side of the second integrated device.

Aspect 39: The apparatus of aspects 16 through 27, wherein the plurality of first pillar interconnects is coupled to a first side of the metallization portion, and wherein the plurality of second pillar interconnects is coupled to a second side of the metallization portion, wherein the second side is opposite to the first side.

Aspect 40: The apparatus of aspects 16 through 27, wherein the plurality of first pillar interconnects is coupled to a first side of the means for metallization interconnection, and wherein the plurality of second pillar interconnects is coupled to a second side of the means for metallization interconnection, wherein the second side is opposite to the first side.

Aspect 41: A package comprising a first integrated device comprising a plurality of first pillar interconnects; an encapsulation layer at least partially encapsulating the first integrated device; a plurality of metallization layer interconnects coupled to the plurality of first pillar interconnects; and a second integrated device comprising a plurality of second pillar interconnects, wherein the second integrated device is coupled to the plurality of metallization layer interconnects through the plurality of second pillar interconnects and a plurality of solder interconnects.

Aspect 42: The package of aspect 41, wherein a second pillar interconnect from the plurality of second pillar interconnects vertically overlaps with a first pillar interconnects from the plurality of first pillar interconnects.

Aspect 43: The package of aspects 41 through 42, wherein at least two second pillar interconnects from a row second pillar interconnects from the plurality of second pillar interconnects vertically overlaps with at least two first pillar interconnects from a row of first pillar interconnects from the plurality of first pillar interconnects.

Aspect 44: The package of aspects 41 through 43, wherein a first pillar interconnect from the plurality of first pillar interconnects is coupled to a backside of a first metallization layer interconnect from the plurality of metallization layer interconnects, and wherein a second pillar interconnect from the plurality of second pillar interconnects is coupled to a frontside of the first metallization layer interconnect.

Aspect 45: The package of aspects 41 through 44, wherein the second integrated device at least partially overlaps vertically with the first integrated device.

Aspect 46: The package of aspects 41 through 45, wherein the plurality of first pillar interconnects is directly coupled to at least part of the plurality of metallization layer interconnects.

Aspect 47: The package of aspects 41 through 46, wherein the first integrated device is configured to be coupled to the second integrated device through the plurality of metallization layer interconnects. The first integrated device may be configured to be electrically coupled to the second integrated device through the plurality of metallization layer interconnects.

Aspect 48: The package of aspects 41 through 47, further comprising a plurality of under bump metallization (UBM) interconnects coupled to at least part of the plurality of metallization layer interconnects; and a plurality of package pillar interconnects coupled to the plurality of UBM interconnects.

Aspect 49: The package of aspects 41 through 48, wherein the plurality of metallization layer interconnects includes a plurality of redistribution layer (RDL) interconnects.

Aspect 50: The package of aspects 41 through 49, further comprising an underfill located between the second integrated device and the plurality of metallization layer interconnects.

Aspect 51: The package of aspects 41 through 50, wherein a frontside of the first integrated device faces the plurality of metallization layer interconnects, and wherein a frontside of the second integrated device faces the plurality of metallization layer interconnects.

Aspect 52: The package of aspects 41 through 51, wherein at least one metallization layer interconnect includes a side profile that includes a U-shape and/or a V-shape.

Aspect 53: The package of aspects 41 through 52, further comprising a backside lamination layer located over a backside of the first integrated device.

Aspect 54: The package of aspects 41 through 53, wherein the plurality of metallization layer interconnects includes one metal layer. In some implementations, the plurality of metallization layer interconnects includes only one metal layer.

Aspect 55: The package of aspects 41 through 54, wherein the first integrated device includes a first bare semiconductor die, and wherein the second integrated device includes a second bare semiconductor die.

Aspect 56: The package of aspects 41 through 55, wherein the plurality of first pillar interconnects is coupled to a first side of the plurality of metallization layer interconnects, and wherein the plurality of second pillar interconnects is coupled to a second side of the plurality of metallization layer interconnects, wherein the second side is opposite to the first side.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. A package comprising:
 a first integrated device including a plurality of first pillar interconnects;
 an encapsulation layer at least partially encapsulating the first integrated device, wherein the encapsulation layer is located between two or more first pillar interconnects from the plurality of first pillar interconnects;
a metallization portion coupled to (i) the plurality of first pillar interconnects of the first integrated device and (ii) the encapsulation layer,
wherein the metallization portion includes at least one passivation layer and a plurality of metallization layer interconnects,
wherein the plurality of first pillar interconnects is coupled to a bottom side of the plurality of metallization layer interconnects; and
a second integrated device including a plurality of second pillar interconnects, wherein the second integrated device is coupled to a top side of the plurality of metallization layer interconnects through the plurality of second pillar interconnects and a plurality of solder interconnects;
a plurality of under bump metallization (UBM) interconnects coupled to at least part of the plurality of metallization layer interconnects;
a plurality of package pillar interconnects coupled to the plurality of UBM interconnects; and
a second plurality of solder interconnects coupled to and touching the plurality of package pillar interconnects, and
wherein the plurality of package pillar interconnects are free of being touched by any encapsulation layer,
wherein the plurality of package pillar interconnects are located laterally to the second integrated device,
wherein a frontside of the second integrated device faces the metallization portion, and
wherein a frontside of the first integrated device faces the metallization portion.

2. The package of claim 1, wherein a second pillar interconnect from the plurality of the second pillar interconnects vertically overlaps with a first pillar interconnect from the plurality of first pillar interconnects.

3. The package of claim 1, wherein at least two second pillar interconnects from a row second pillar interconnects from the plurality of second pillar interconnects vertically overlaps with at least two first pillar interconnects from a row of first pillar interconnects from the plurality of first pillar interconnects.

4. The package of claim 1,
wherein a first pillar interconnect from the plurality of the first pillar interconnects is coupled to a bottom side of a first metallization layer interconnect from the plurality of metallization layer interconnects, and
wherein a second pillar interconnect from the plurality of second pillar interconnects is coupled to a top side of the first metallization layer interconnect.

5. The package of claim 1, wherein the second integrated device at least partially overlaps vertically with the first integrated device.

6. The package of claim 1, wherein the plurality of first pillar interconnects is directly coupled to at least part of the plurality of metallization layer interconnects.

7. The package of claim 1, wherein the first integrated device is configured to be coupled to the second integrated device through the plurality of metallization layer interconnects.

8. The package of claim 1, wherein the first integrated device is configured to be electrically coupled to the second integrated device through an electrical path that includes a pillar interconnect from the plurality of first pillar interconnects, the metallization portion, a solder interconnect from the plurality of solder interconnect and a pillar interconnect from the plurality of second pillar interconnects.

9. The package of claim 1, wherein the plurality of metallization layer interconnects includes a plurality of redistribution layer (RDL) interconnects.

10. The package of claim 1, further comprising an underfill located between the second integrated device and the plurality of metallization layer interconnects.

11. The package of claim 1,
wherein the frontside of the first integrated device faces the plurality of metallization layer interconnects,
wherein the frontside of the second integrated device faces the plurality of metallization layer interconnects,
wherein the encapsulation layer is located between the first integrated device and the metallization portion, and
wherein the encapsulation layer touches (i) the frontside of the first integrated device and (ii) a side surface of the first integrated device.

12. The package of claim 1, wherein at least one metallization layer interconnect includes a side profile that includes a U-shape and/or a V-shape.

13. The package of claim 1, further comprising a backside lamination layer located over a backside of the first integrated device.

14. The package of claim 1, wherein the plurality of metallization layer interconnects includes one metal layer.

15. The package of claim 1,
wherein the first integrated device includes a first bare semiconductor die, and
wherein the second integrated device includes a second bare semiconductor die.

16. An apparatus comprising:
a first integrated device comprising a plurality of first pillar interconnects;
means for encapsulation at least partially encapsulating the first integrated device, wherein the means for encapsulation is located between two or more first pillar interconnects from the plurality of first pillar interconnects;
a metallization portion coupled to (i) the first plurality of pillar interconnects of the first integrated device and (ii) the means for encapsulation,
wherein the metallization portion includes at least one passivation layer and means for metallization interconnection, and
wherein the plurality of first pillar interconnects is coupled to a bottom side of the means for metallization interconnection;
a second integrated device comprising a plurality of second pillar interconnects, wherein the second integrated device is coupled to a top side of the metallization interconnection through the plurality of second pillar interconnects and a first plurality of solder interconnects;
a plurality of package pillar interconnects coupled to the top side of the metallization interconnection, wherein the plurality of package pillar interconnects are located laterally to the second integrated device, and
a second plurality of solder interconnects coupled to and touching the plurality of package pillar interconnects,
wherein a frontside of the second integrated device faces the metallization portion, and
wherein a frontside of the first integrated device faces the metallization portion.

17. The apparatus of claim 16, wherein a second pillar interconnect from the plurality of the second pillar interconnects vertically overlaps with a first pillar interconnect from the plurality of the first pillar interconnects.

18. The apparatus of claim 16, wherein at least two second pillar interconnects from a row second pillar interconnects from the plurality of second pillar interconnects vertically overlaps with at least two first pillar interconnects from a row of first pillar interconnects from the plurality of first pillar interconnects.

19. The apparatus of claim 16,
wherein a first pillar interconnect from the plurality of first pillar interconnects is coupled to the bottom side of the means for metallization interconnection, and
wherein a second pillar interconnect from the plurality of second pillar interconnects is coupled to the top side of the means for metallization interconnection.

20. The apparatus of claim 16, wherein the second integrated device at least partially overlaps vertically with the first integrated device.

21. The apparatus of claim 16, wherein the plurality of first pillar interconnects is directly coupled to the means for metallization interconnection.

22. The apparatus of claim 16, wherein the first integrated device is configured to be coupled to the second integrated device through the means of metallization interconnection.

23. The apparatus of claim 16, further comprising:
a plurality of under bump metallization (UBM) interconnects coupled to the means for metallization interconnection;
wherein the plurality of package pillar interconnects is coupled to the plurality of UBM interconnects, and
wherein the plurality of package pillar interconnects are free of being touched by any encapsulation layer.

24. The apparatus of claim 16, further comprising an underfill located between the second integrated device and the means for metallization interconnection.

25. The apparatus of claim 16,
wherein the frontside of the first integrated device faces the means for metallization interconnection,
wherein the frontside of the second integrated device faces the means for metallization interconnection,
wherein the means for encapsulation is located between the first integrated device and the metallization portion, and
wherein the means for encapsulation touches (i) the frontside of the first integrated device and (ii) a side surface of the first integrated device.

26. The apparatus of claim 16, wherein the means for metallization interconnection includes at least one interconnect comprising a side profile that includes a U-shape and/or a V-shape.

27. The apparatus of claim 16, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

28. A method for fabricating a package, comprising:
providing a first integrated device comprising a plurality of first pillar interconnects;
forming an encapsulation layer over the first integrated device and between two or more first pillar interconnects from the plurality of first pillar interconnects;
forming a metallization portion over the first integrated device and the encapsulation layer, such that a front side of the first integrated device faces the metallization portion,
wherein forming the metallization portion includes forming at least one passivation layer and forming a plurality of metallization layer interconnects, and
wherein the plurality of metallization layer interconnects is formed such that a bottom side of the plurality of metallization layer interconnects is coupled to the plurality of first pillar interconnects; and
forming a plurality of package pillar interconnects that are coupled to the metallization portion;
coupling a second integrated device to a top side of the plurality of metallization layer interconnects through a plurality of second pillar interconnects and a plurality of solder interconnects, such that a front side of the second integrated device faces the metallization portion, wherein the second integrated device is located laterally to the plurality of package pillar interconnects.

29. The method of claim 28, wherein at least one second pillar interconnect vertically overlaps with a first pillar interconnect.

30. The method of claim 28, wherein at least two second pillar interconnects from a row second pillar interconnects from the plurality of second pillar interconnects vertically overlaps with at least two first pillar interconnects from a row of first pillar interconnects from the plurality of first pillar interconnects.

31. The method of claim 28,
wherein a first pillar interconnect from the plurality of first pillar interconnects is coupled to a bottom side of a first metallization layer interconnect, and
wherein a second pillar interconnect from the plurality of second pillar interconnects is coupled to a top side of the first metallization layer interconnect.

32. The method of claim 28, wherein the second integrated device at least partially overlaps vertically with the first integrated device.

33. The method of claim 28, wherein the plurality of first pillar interconnects is directly coupled to at least part of the plurality of metallization layer interconnects.

* * * * *